US012677672B2

(12) United States Patent
Lee et al.

(10) Patent No.: US 12,677,672 B2
(45) Date of Patent: Jul. 7, 2026

(54) SEMICONDUCTOR DEVICE INCLUDING AN ALIGNMENT PATTERN

(71) Applicant: SK hynix Inc., Gyeonggi-do (KR)

(72) Inventors: Seung Won Lee, Gyeonggi-do (KR);
Hyung Jin Park, Gyeonggi-do (KR);
Han Bit Kim, Gyeonggi-do (KR);
Jeong Woo Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 761 days.

(21) Appl. No.: 17/986,976

(22) Filed: Nov. 15, 2022

(65) Prior Publication Data

US 2024/0006333 A1 Jan. 4, 2024

(30) Foreign Application Priority Data

Jun. 30, 2022 (KR) ........................ 10-2022-0080451

(51) Int. Cl.
*H10W 46/00* (2026.01)
*H10W 42/00* (2026.01)

(52) U.S. Cl.
CPC .......... *H10W 46/00* (2026.01); *H10W 42/121* (2026.01); *H10W 46/301* (2026.01); *H10W 46/503* (2026.01)

(58) Field of Classification Search
CPC . H10W 46/00; H10W 42/121; H10W 46/301; H10W 46/503; H10W 42/00; H10P 54/00
See application file for complete search history.

(56) References Cited

U.S. PATENT DOCUMENTS 6,352,904 B2 * 3/2002 Tan .......................... G03F 9/708
257/E23.179
10,784,278 B2 * 9/2020 Huang ................... H10B 43/27
(Continued)

FOREIGN PATENT DOCUMENTS

KR 10-2005-0051448 A 6/2005
KR 10-2009-0047614 A 5/2009
(Continued)

OTHER PUBLICATIONS

Cui et al., "Segmented Alignment Mark Optimization and Signal Strength Enhancement for Deep Trench Process", Proceedings of SPIE vol. 5375, pp. 1265-1277 (SPIE, Bellingham, WA, 2004) (Year: 2004).*

(Continued)

*Primary Examiner* — Britt Hanley
*Assistant Examiner* — Victor V Barzykin
(74) *Attorney, Agent, or Firm* — IP & T GROUP LLP

(57) ABSTRACT

A semiconductor includes an underlayer; a lower core layer spaced apart from the underlayer, the lower core layer including a plurality of lower segments spaced apart from each other in a horizontal direction; an upper core layer spaced apart from the lower core layer, the upper core layer including a plurality of upper segments spaced apart from each other in the horizontal direction; a post pattern vertically penetrating the upper core layer and the lower core layer; a passivation layer surrounding the lower core layer, the upper core layer, and the post pattern; coating layer surrounding the passivation layer; and a support pattern extending in the vertical direction and passing through the lower core layer, the upper core layer, the passivation layer, and the coating layer.

16 Claims, 21 Drawing Sheets

(56)            References Cited

U.S. PATENT DOCUMENTS

| 11,145,601 B2 * | 10/2021 | Kim ...................... H10W 46/00 |
| 2005/0139964 A1 * | 6/2005 | Ando .................... H10P 74/277 |
| | | 257/620 |
| 2009/0039470 A1 | 2/2009 | Vo |
| 2011/0089581 A1 * | 4/2011 | Pol ........................ H10W 46/00 |
| | | 257/E23.179 |
| 2022/0301908 A1 * | 9/2022 | Takahata ............... G03F 9/7042 |

FOREIGN PATENT DOCUMENTS

| KR | 10-2014-0017271 A | 2/2014 |
| KR | 10-2020-0101717 A | 8/2020 |

OTHER PUBLICATIONS

Notice of Allowance for Korean Patent Application No. 10-2022-0080451 issued by the Korean Patent Office on May 9, 2026.

* cited by examiner

SEMICONDUCTOR DEVICE INCLUDING AN ALIGNMENT PATTERN

The present application claims priority of Korean Patent Application No. 10-2022-0080451, filed on Jun. 30, 2022, which is incorporated herein by reference in its entirety.

BACKGROUND

1. Field

The present invention disclosure provides a semiconductor device including an alignment pattern and a method for manufacturing the semiconductor device.

2. Description of the Related Art

As the degree of integration of semiconductor devices gradually increases, alignment patterns are also being refined which presents challenges in the manufacturing operations.

SUMMARY

An embodiment of the present invention disclosure provides an alignment pattern having a support pattern.

An aspect of the present invention disclosure is directed to a semiconductor device including an alignment pattern having a support pattern.

Another aspect of the present invention disclosure provides a method of forming an alignment pattern having a support pattern.

Yet another aspect of the present invention disclosure provides a method of manufacturing a semiconductor device including an alignment pattern having a support pattern.

In accordance with some embodiments of the present invention disclosure, a semiconductor device includes an underlayer; a lower core layer spaced apart from the underlayer in a vertical direction from a top surface of the underlayer, wherein the lower core layer extends in a horizontal direction parallel to the top surface of the underlayer, and wherein the lower core layer includes a plurality of lower segments spaced apart from each other in the horizontal direction; an upper core layer spaced apart from the lower core layer in the vertical direction, wherein the upper core layer extends in the horizontal direction, and wherein the upper core layer includes a plurality of upper segments spaced apart from each other in the horizontal direction; a post pattern vertically penetrating the upper core layer and the lower core layer; a passivation layer surrounding the lower core layer, the upper core layer, and the post pattern; coating layer surrounding the passivation layer; and a support pattern extending in the vertical direction and passing through the lower core layer, the upper core layer, the passivation layer, and the coating layer.

In accordance with some embodiments of the present invention disclosure, a semiconductor device includes an alignment pattern, the alignment pattern includes an underlayer; a core layer including segments spaced apart from the under layer in a vertical direction, wherein the segments are individually divided in a horizontal direction; a passivation layer surrounding a surface of the core layer; a coating layer surrounding a surface of the passivation layer; a support pattern vertically passing through the core layer, the passivation layer, and the coating layer; an empty space between the under layer and the core layer; and a gap between the segments of the coating layer. The support pattern vertically passes through the gap.

In accordance with some embodiments of the present invention disclosure, a semiconductor device includes an alignment pattern including sub-alignment patterns. The sub-alignment patterns are arranged in a pinwheel shape. Each of the sub-alignment patterns includes a plurality of unit alignment patterns arranged in side-by-side. At least one of the unit alignment patterns includes support patterns disposed therein.

In accordance with some embodiments of the present invention disclosure, a semiconductor device includes an underlayer; a barrier layer on the underlayer; a passivation layer on the barrier layer; a lower core layer formed inside the passivation layer, the lower core layer including a plurality of lower segments extending in a horizontal direction parallel to the barrier layer and the underlayer; an upper core layer formed inside the passivation layer, the upper core layer including a plurality of spaced apart upper segments extending in the horizontal direction; at least one post pattern penetrating the upper core layer, the lower core layer and the passivation layer to expose the barrier layer, the at least one post pattern being configured to support at least one of the upper and lower segments; a coating layer surrounding a surface of the passivation layer; and a support pattern including a plurality of lower support patterns and a plurality of upper support patterns vertically passing through the lower core layer, the upper core layer, the passivation layer, and the coating layer.

DETAILED DESCRIPTION

Figure 1A:
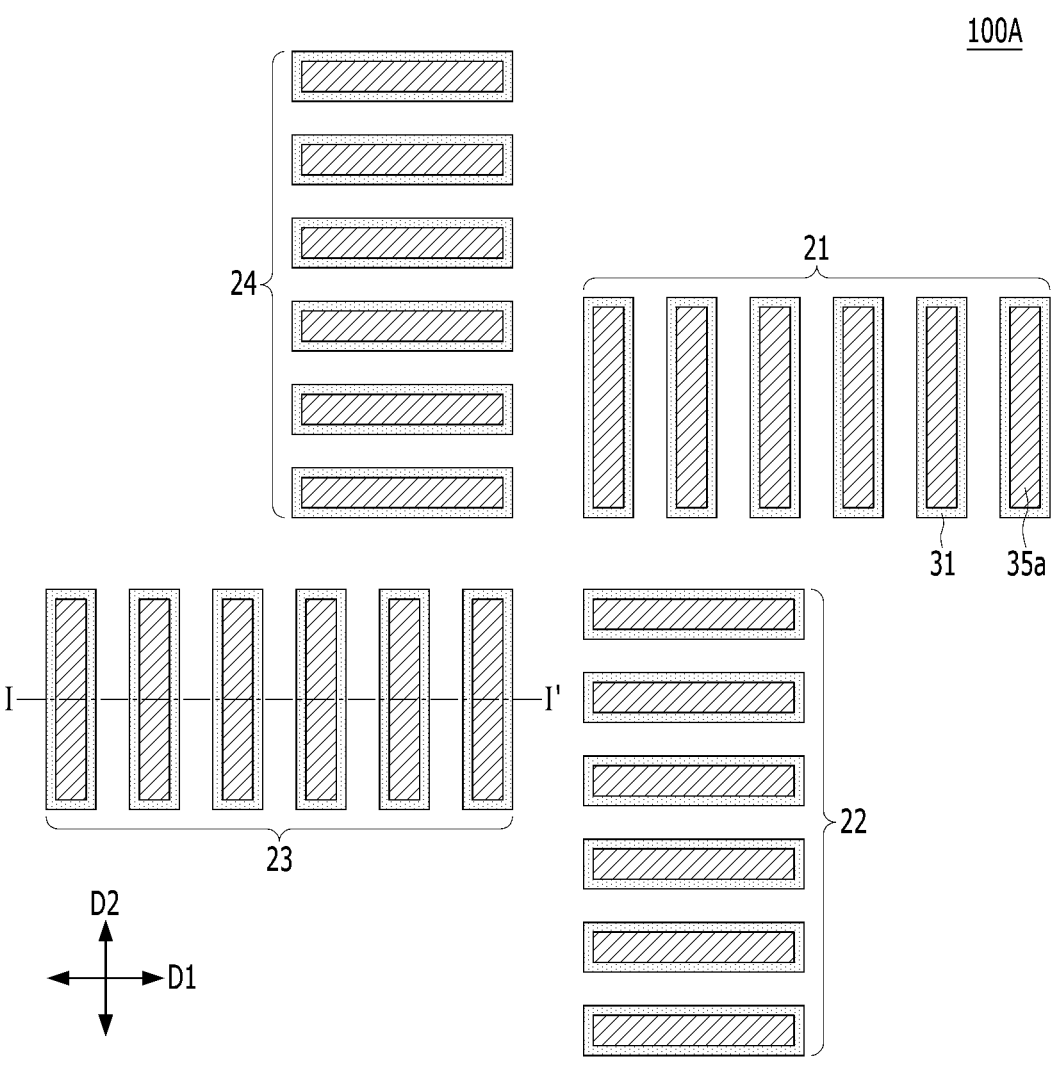
FIGS. 1A to 1D are plan views illustrating alignment patterns of a semiconductor device according to embodiments of the present invention disclosure.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present invention disclosure. Similarly, the second element could also be termed the first element.

Other expressions that explain the relationship between elements, such as "between", "directly between", "adjacent to" or "directly adjacent to" should be construed in the same way.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1D are plan views illustrating alignment patterns 100A-100D of a semiconductor device according to embodiments of the present invention disclosure. Referring to FIGS. 1A to 1D, alignment patterns 100A to 100D of semiconductor devices according to embodiments of the present invention disclosure may include four sub-alignment patterns 21 to 24 arranged in a pinwheel shape in a first direction D1 and a second direction D2, respectively. The four sub-alignment patterns 21 to 24 may be sequentially arranged in a clockwise direction. For example, the first sub-alignment pattern 21 may be disposed at an upper-right position, the second sub-alignment pattern 22 may be disposed at a lower-right position, the third sub-alignment pattern 23 may be disposed at a lower-left position, and the fourth sub-alignment pattern 24 may be disposed at an upper-left position. Each of the sub-alignment patterns 21 to 24 may include a plurality of rectangular frame type unit alignment patterns 31 arranged side by side. In each of the sub-alignment patterns 21 to 24, the unit alignment patterns 31 may be arranged in parallel with each other. For example, the first sub-alignment pattern 21 may include the plurality of unit alignment patterns 31 each having a rectangular shape frame with the long side extending in the second direction D2 and arranged parallel with each other in the first direction D1. The second sub-alignment pattern 22 may include the plurality of unit alignment patterns 31 each having a rectangular shape frame with the long side extending in the first direction D1 and arranged parallel with each other in the second direction D2. The third sub-alignment pattern 23 may include the plurality of unit alignment patterns 31 each having a rectangular shape frame with the long side extending in the second direction D2 and arranged parallel with each other in the first direction D1. The fourth sub-alignment pattern 24 may include the plurality of unit alignment patterns 31 each having a rectangular shape frame with the long side extending in the first direction D1 and arranged parallel with each other in the second direction D2. The first direction D1 and the second direction D2 may be perpendicular to each other. For example, the first direction D1 may be a direction toward a cell region of the semiconductor chip, and the second direction D2 may be a direction extending along scribe lanes. The alignment patterns 100A to 100D may be disposed in the scribe lanes of the semiconductor wafer. In some embodiments, the alignment patterns 100A to 100D may include a vernier key pattern.

Referring to FIG. 1A, the unit alignment patterns 31 of the sub-alignment patterns 21 to 24 of the alignment pattern 100A of the semiconductor device according to the embodiment of the present invention disclosure may include bar-type support patterns 35a. The bar-type support patterns 35a of the first and third sub-alignment patterns 21 and 23 may be formed in the unit alignment patterns 31. The bar-type support patterns 35a of the first and third sub-alignment patterns 21 and 23 may be arranged side by side in the first direction D1. The bar-type support patterns 35a of the first and third sub-alignment patterns 21 and 23 may have an elongated shape to have a long side extending in the second direction D2. That is, a short side direction of the bar-type support patterns 35a of the first and third sub-alignment patterns 21 and 23 may be extending in the first direction D1, and an elongated direction of the bar-type support patterns 35a of the first and third sub-alignment patterns 21 and 23 may be extending in the second direction D2.

The bar-type support patterns 35a of the second and fourth sub-alignment patterns 22 and 24 may be formed in the unit alignment patterns 31. The bar-type support patterns 35a of the second and fourth sub-alignment patterns 22 and 24 may be arranged side by side in the second direction D2. The bar-type support patterns 35a of the second and fourth sub-alignment patterns 22 and 24 may have an elongated shape to have a long side extending in the first direction D1. That is, a short side direction of the bar-type support patterns 35a of the second and fourth sub-alignment patterns 22 and 24 may be extending in the second direction D2, and an elongated direction of the bar-type support patterns 35a of the second and fourth sub-alignment patterns 22 and 24 may be extending in the first direction D1.

Figure 1B:
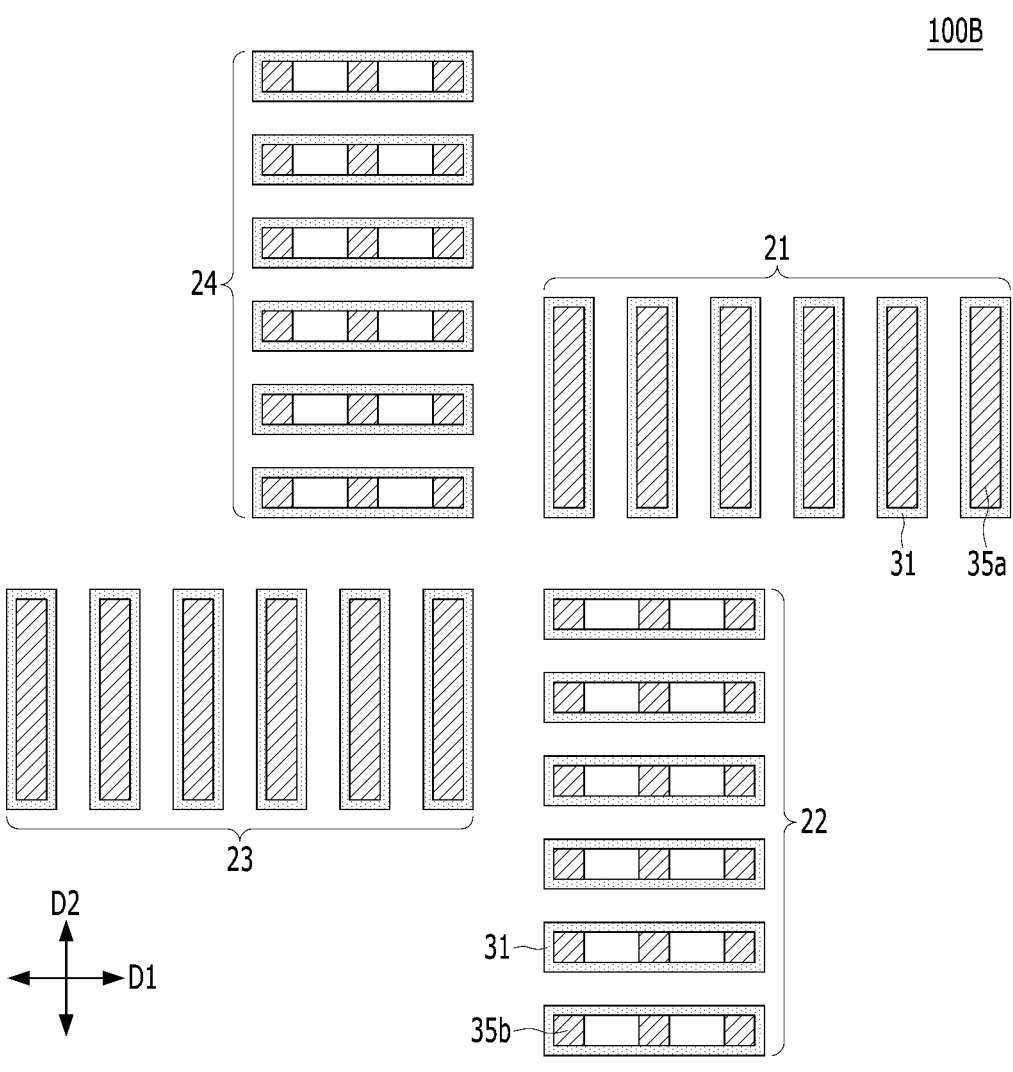

Referring to FIG. 1B, the unit alignment patterns 31 of the sub-alignment patterns 21 to 24 of the alignment pattern 100B of a semiconductor device according to some embodiments of the present invention disclosure may selectively include one of bar-type support patterns 35a and square-type support patterns 35b. The bar-type support patterns 35a may have an elongated shape to have long sides and short sides, and the square-type support patterns 35b may have four sides having similar lengths. For example, the unit alignment patterns 31 of the first and third sub-alignment patterns 21 and 23 may include the bar-type support patterns 35a. The second and fourth sub-alignment patterns 22 and 24 of the unit alignment patterns 31 may include the square-type support patterns 35b. The bar-type support patterns 35a may be formed to extend in the second direction D2 in the unit alignment patterns 31 in the first and third sub-alignment patterns 21 and 23. The square-type support patterns 35b may be arranged to be spaced apart from each other in an island configuration in the unit alignment patterns 31. The square-type support patterns 35b may be formed in the unit alignment patterns 31 in the second sub-alignment pattern 22 and the fourth sub-alignment pattern 24 to be arranged in the first direction D1. The bar-type support patterns 35a may substantially and completely fill the inside of the unit alignment patterns 31, and the square-type support patterns 35b may partially fill the inside of the unit alignment patterns 31. In some embodiments, the bar-type support patterns 35a may partially fill the inside of the unit alignment patterns 31.

Figure 1C:
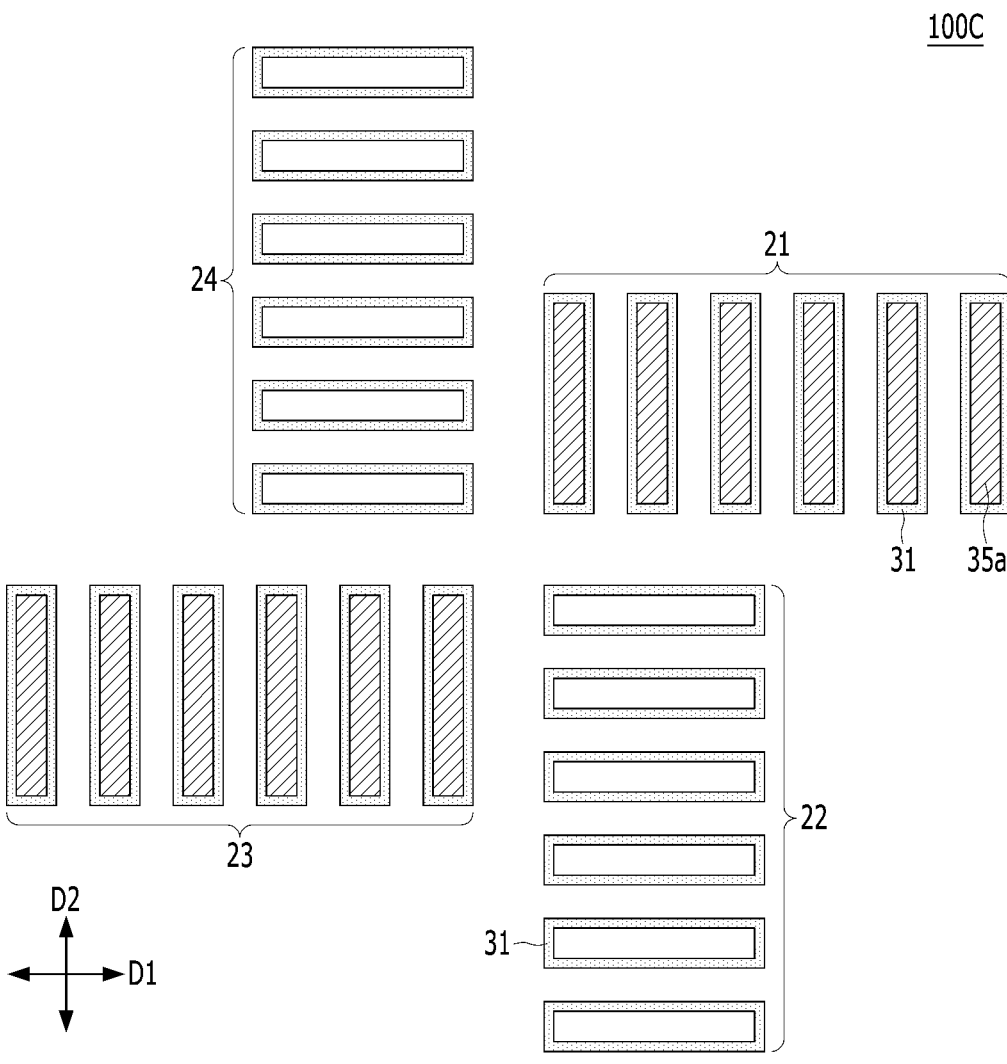

Referring to FIG. 1C, the unit alignment patterns 31 of the first and third sub-alignment patterns 21 and 23 of the alignment pattern 100C of a semiconductor device according to some embodiments of the present invention disclosure may include the bar-type support patterns 35a. Compared with FIGS. 1A and 1B, any of the support patterns 35a and 35*b* may not be formed in the second and fourth sub-alignment patterns 22 and 24.

The bar-type support patterns 35*a* of FIGS. 1A to 1C may block and retard cracks. For example, the bar-type support patterns 35*a* of the first and third sub-alignment patterns 21 and 23 may be perpendicular to the first direction D1, that is, the direction toward the cell region of the semiconductor chip. Accordingly, as described above, the bar-type support patterns 35*a* of the first and third sub-alignment patterns 21 and 23 may block and retard cracks toward the cell region of the semiconductor chip, and the bar-type support patterns 35*a* of the second and fourth sub-alignment patterns 22 and 24 may block and retard cracks along the scribe lanes of the semiconductor chip.

Figure 1D:
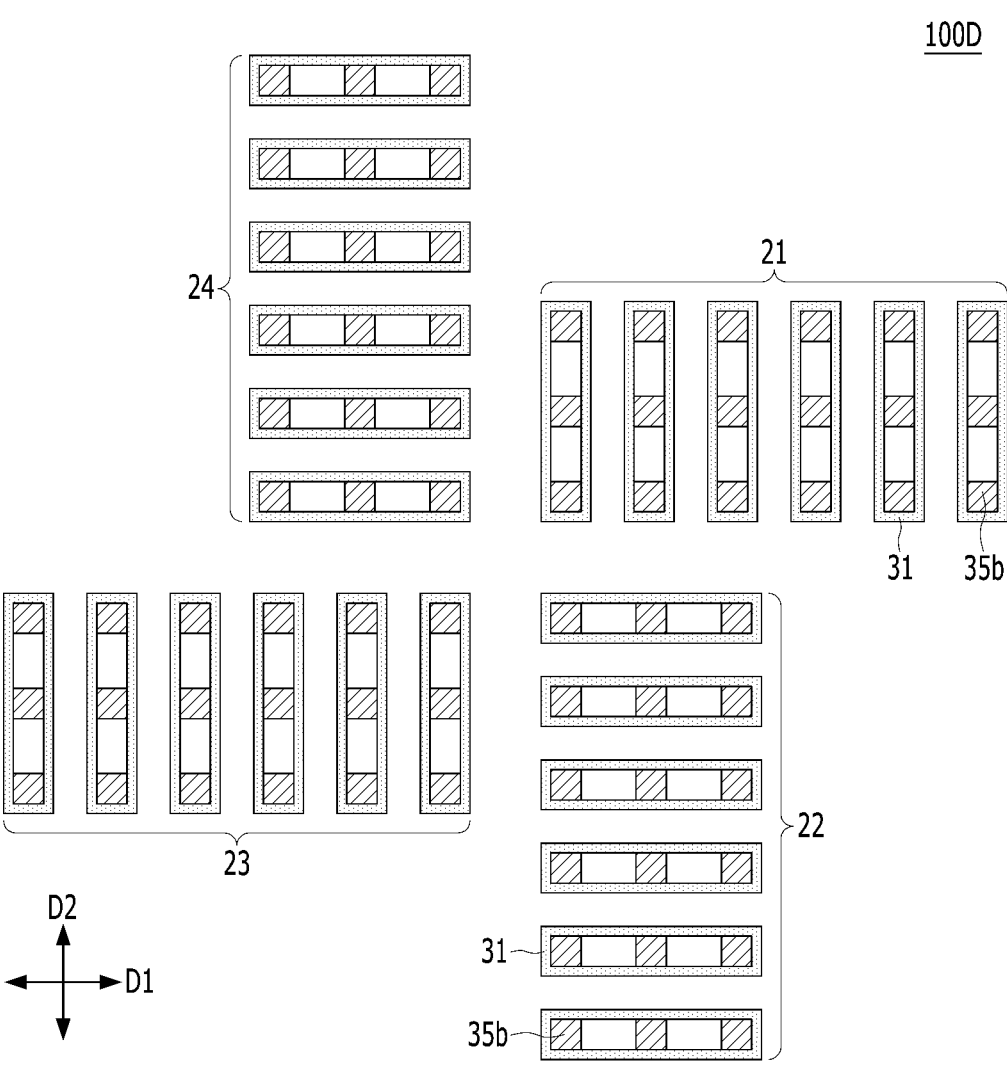

Referring to FIG. 1D, the unit alignment patterns 31 in the sub-alignment patterns 21 to 24 of the alignment pattern 100D of a semiconductor device according to some embodiments of the present invention disclosure may include the square-type support patterns 35*b*. The square-type support patterns 35*b* shown in FIGS. 1B and 1D may prevent the unit alignment patterns 31 from collapsing.

Figure 2A:
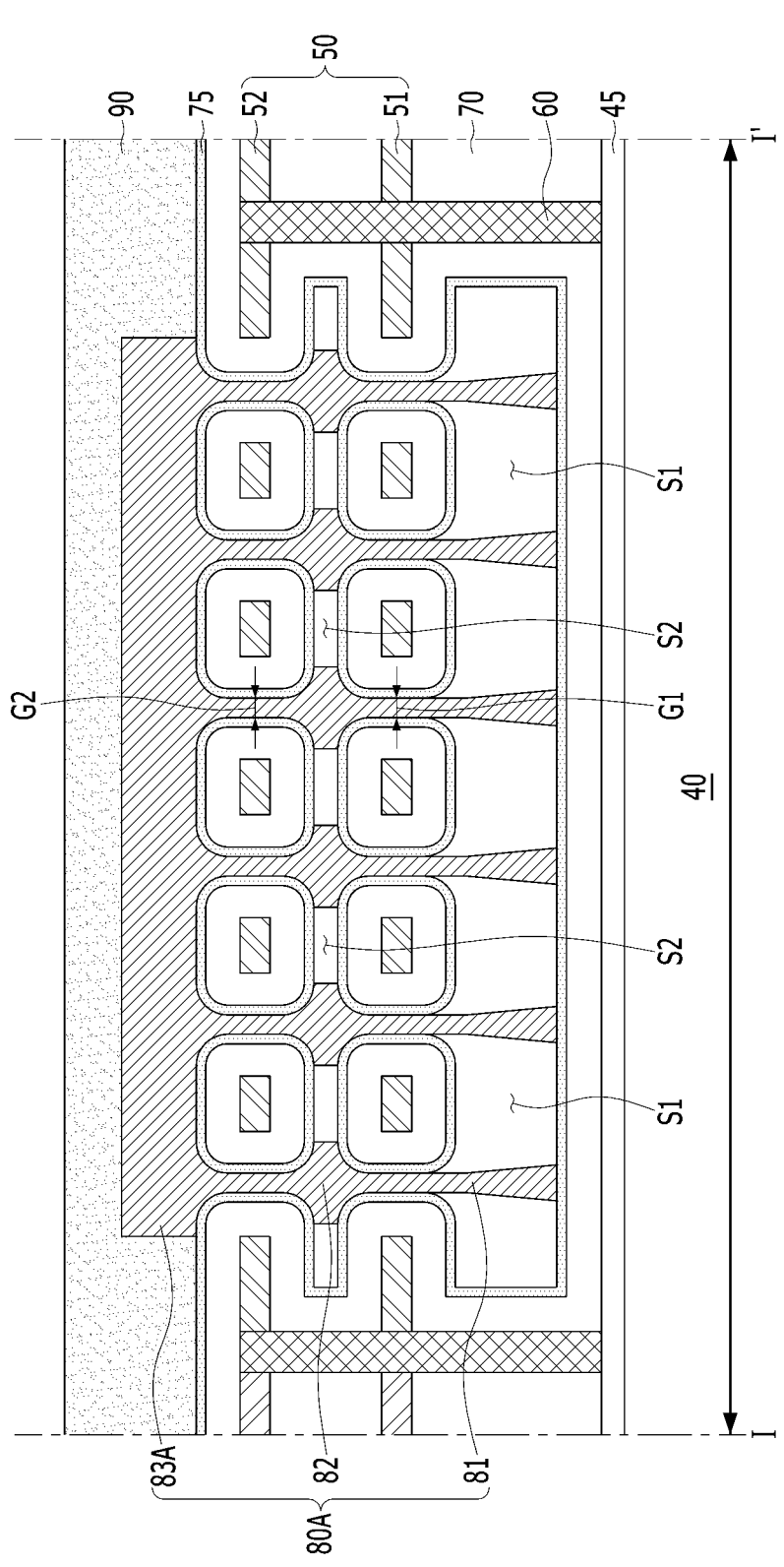
FIGS. 2A to 2D are longitudinal cross-sectional views taken along line I-I' of FIG. 1A to illustrate an alignment pattern of a semiconductor device according to some embodiments of the present invention disclosure.

FIGS. 2A to 2D are longitudinal cross-sectional views taken along line I-I' of FIG. 1A to illustrate an alignment pattern of a semiconductor device according to some embodiments of the present invention disclosure. Referring to FIG. 2A, an alignment pattern of a semiconductor device according to some embodiments of the present invention disclosure may include an underlayer 40, a barrier layer 45, core layers 50, post patterns 60, a passivation layer 70, a coating layer 75, a support pattern 80A, and a capping insulating layer 90. The alignment pattern may further include empty spaces S1 and S2 therein. The empty spaces S1 and S2 may be spatially defined to be surrounded by the coating layer 75 and the support pattern 80A.

The underlayer 40 may include one of a semiconductor substrate, an interlayer insulating layer, an etch stop layer, a planarization layer, or other insulating material layers. In some embodiments, the underlayer 40 may include a conductive layer such as a metal layer or a metal compound layer. In some embodiments, the underlayer 40 may be disposed at the same level as a storage contact or a landing pad of a DRAM cell.

The barrier layer 45 may be formed on the underlayer 40 to be flat. The barrier layer 45 may include at least one of a barrier metal layer or a barrier insulating layer. In some embodiments, the barrier metal layer may include at least one of a titanium (Ti) layer, a titanium nitride (TiN) layer, a tantalum (Ta) layer, a tantalum nitride (TaN) layer, or a tungsten nitride (WN) layer. In some embodiments, the barrier insulating layer may include an inorganic layer such as a silicon nitride (SiN) layer or a silicon carbon nitride (SiCN) layer that does not contain oxygen.

The core layers 50 may include a lower core layer 51 and an upper core layer 52 disposed on the lower core layer. The lower core layer 51 and the upper core layer 52 may extend in a horizontal direction and may be spaced apart from each other in a vertical direction. The barrier layer 45 and the lower core layer 51 may be spaced apart from each other in the vertical direction. A lower empty space S1 may be formed between the barrier layer 45 and the lower core layer 51. The lower core layer 51 and the upper core layer 52 may also be spatially separated. An upper empty space S2 may be formed between the lower core layer 51 and the upper core layer 52. In an embodiment, the lower core layer 51 and the upper core layer 52 may each be discontinuous. For example, the lower core layer 51 may have a plurality of lower segments spaced apart from each other in the horizontal direction. The lower core layer 51 and the upper core layer 52 may each have a plurality of upper segments spaced apart from each other in the horizontal direction. The core layers 50 may include an inorganic layer such as a silicon nitride (SiN) layer. The lower core layer 51 and the upper core layer 52 may have substantially the same planar structure. The core layers 50 may include an opaque material.

The post patterns 60 may vertically penetrate the core layers 50 and the passivation layer 70. The post patterns 60 may support the core layers 50 to prevent the core layers 50 from collapsing. The post patterns 60 may include a material having an etch selectivity with respect to the core layers 50 and silicon oxide ($SiO_2$). For example, the post patterns 60 may include polycrystalline silicon, silicon germanium (SiGe), silicon nitride (SiN), or a metal-based material. The post patterns 60 may have a pillar shape. In some embodiments, the post patterns 60 may form a wall shape. The post patterns 60 may be opaque.

The passivation layer 70 may be conformally formed on surfaces of the barrier layer 45, the core layers 50, and the post pattern 60. The passivation layer 70 may include polycrystalline silicon. The passivation layer 70 may provide a spacing between the core layers 50. The passivation layer 70 may provide the volume for the empty spaces S1 and S2. The passivation layer 70 may include silicon germanium (SiGe). By controlling the volume of the passivation layer 70, the spacing between the core layers 50 may be adjusted. Also, by controlling the volume of the passivation layer 70, the volume of the empty spaces S1 and S2 may be adjusted as well. The passivation layer 70 may be opaque.

The coating layer 75 may be conformally formed on a surface of the passivation layer 70. The coating layer 75 may reflect light. For example, the coating layer 75 may include a metal layer or a metal nitride layer. In some embodiments, the coating layer 75 may include tungsten nitride (WN). In some embodiments, the coating layer 75 may include at least one of titanium (Ti), titanium nitride (TiN), tantalum (Ta), tantalum nitride (TaN), or tungsten (W). A plurality of gaps G1 and G2 may be defined by the passivation layer 70 and the coating layer 75. For example, a horizontal width of the lower gaps G1 may be defined by the coating layer 75 surrounding the passivation layer 70 surrounding the segments of the lower core layer 51 spaced apart from each other in the horizontal direction. A horizontal width of the upper gaps G2 may be defined by the coating layer 75 surrounding the passivation layer 70 surrounding the segments of the upper core layer 52 spaced apart from each other in the horizontal direction. The lower gaps G1 may be located at the same level as the lower core layer 51. The upper gaps G2 may be located at the same level as the upper core layer 52.

The support pattern 80A may vertically pass through the upper gaps G2 and the lower gaps G1 to be positioned on the barrier layer 45 on the underlayer 40. That is, the support pattern 80A may vertically pass through the lower core layer 51, the upper core layer 52, the passivation layer 70, and the coating layer 75. The support pattern 80A may include a plurality of lower support patterns 81, a plurality of intermediate support patterns 82, and an upper support pattern 83A.

Each of the lower support patterns 81 may include a lower portion and an upper portion. The lower portion of each of the lower support patterns 81 may spatially and horizontally separate the lower empty space S1. The upper portion of each of the lower support patterns 81 may be positioned in the lower gap G1.

Each of the lower support patterns 81 may have a pillar shape or a wall shape extending from the lower empty space S1 to the lower gap G1. The lower portion of each of the lower support patterns 81 may have a relatively wider width, and the upper portion of each of the lower support patterns 81 may have a relatively narrower width. That is, a horizontal width of the lower portion of each of the lower support patterns 81 may be wider than a horizontal width of the upper portion of each of the lower support patterns 81. For example, each of the lower support patterns 81 may have a trapezoid-shaped longitudinal cross-section. Each of the lower support patterns 81 may be in contact with the coating layer 75 surrounding the passivation layer 70 surrounding the lower core layer 51 in the lower gap G1.

Each of the intermediate support patterns 82 may include a lower portion positioned in the lower gap G1 and an upper portion positioned in the upper gap G2. Each of the intermediate support patterns 82 may have a pillar shape or a wall shape extending from an upper portion of the lower gap G1 to a lower portion of the upper gap G2. Each of the intermediate support patterns 82 may have a cross shape in a side view. Each of the intermediate support patterns 82 may have the wall shape extending from a frontside to a backside of in the figure. For example, each of the intermediate support patterns 82 may have the wall shape extending from a left side to a right side in a left of right side view. Each of the intermediate support patterns 82 may spatially and horizontally separate the upper empty space S2. The lower portion of each of the intermediate support patterns 82 may be located in the lower gap G1. The upper portion of each of the intermediate support patterns 82 may be located in the upper gap G2. Each of the intermediate support patterns 82 may have a convex central portion. For example, each of the intermediate support patterns 82 may have side portions laterally protruding to the upper empty space S2. The lower portion of each of the intermediate support patterns 82 may be in contact with the coating layer 75 surrounding the passivation layer 70 surrounding the lower core layer 51 in the lower gap G1. The upper portion of each of the intermediate support patterns 82 may be in contact with the coating layer 75 surrounding the passivation layer 70 surrounding the upper core layer 52 in the upper gap G2. The lower support patterns 81 and the intermediate support patterns 82 may include the same material. Accordingly, interfaces between the lower support patterns 81 and the intermediate support patterns 82 may virtually exist. That is, the lower support patterns 81 and the intermediate support patterns 82 may be materially continued.

The upper support pattern 83A may include lower portions positioned in the upper gap G2 and an upper portion disposed on an upper surface of the coating layer 75 surrounding the passivation layer 70 surrounding the upper core layers 52. The lower portions of the upper support pattern 83A may have a pillar shape or a wall shape, and the upper portion of the upper support pattern 83A may have a bridge shape or a plate shape horizontally extending on the coating layer 75 surrounding the passivation layer 70 surrounding the upper core layer 52. The intermediate support patterns 82 and the upper support pattern 83A may include the same material. Accordingly, interfaces between the intermediate support patterns 82 and the upper support pattern 83A may virtually exist. That is, the intermediate support patterns 82 and the upper support pattern 83A may be materially continued.

The capping insulating layer 90 may be formed on the upper support pattern 83A and the coating layer 75 to cover the upper support pattern 83A. The capping insulating layer

90 may include an inorganic insulating material layer such as a silicon oxide ($SiO_2$) layer.

Figure 2B:
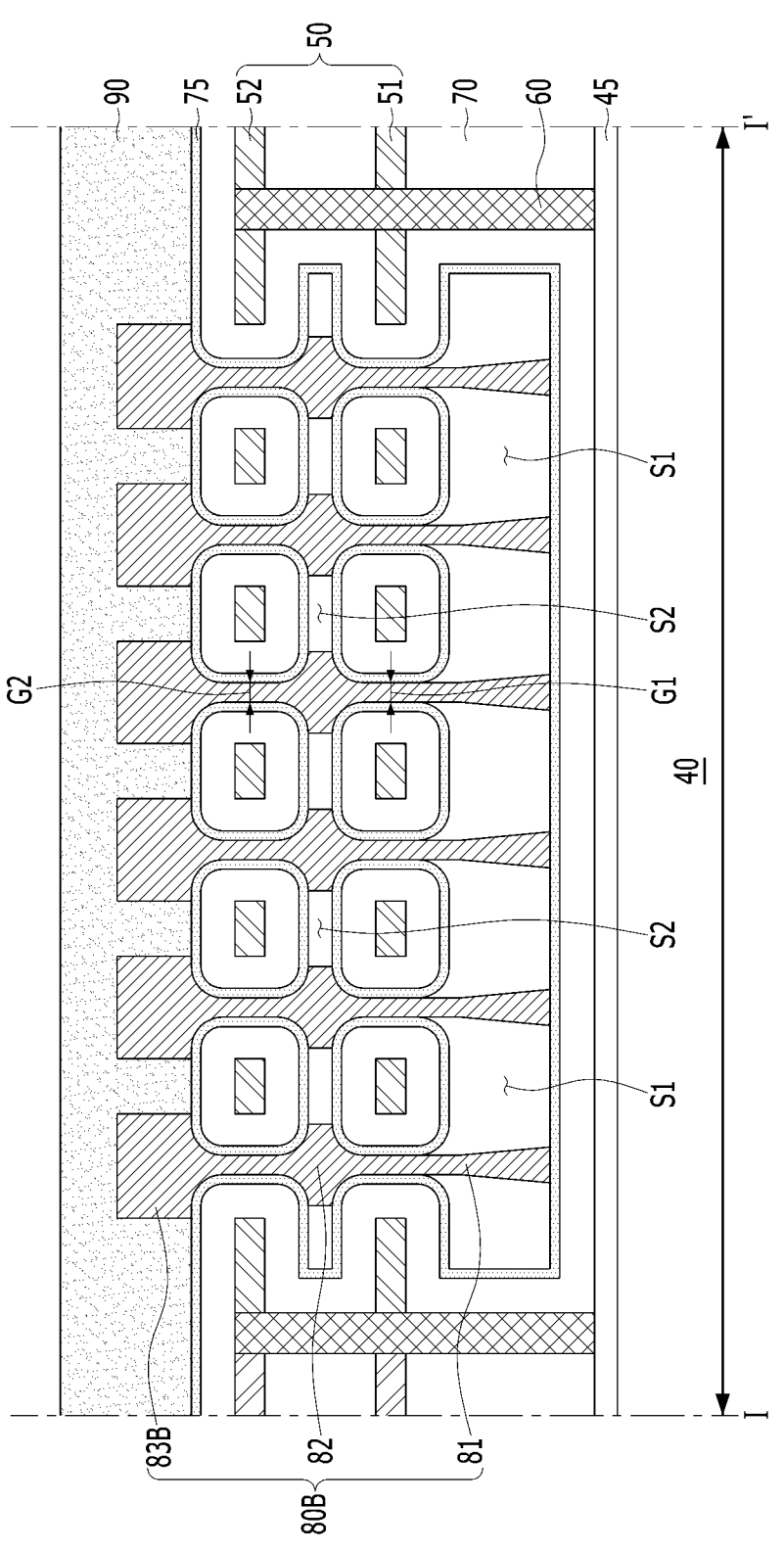

Referring to FIG. 2B, an alignment pattern of a semiconductor device according to some embodiments of the present invention disclosure may include an underlayer 40, a barrier layer 45, core layers 50, post patterns 60, a passivation layer 70, a coating layer 75, a support pattern 80B, and a capping insulating layer 90. The alignment pattern may further include empty spaces S1 and S2 therein. The support pattern 80B may include a plurality of lower support patterns 81, a plurality of intermediate support patterns 82, and a plurality of upper support pattern 83B. The upper support pattern 83B may have a pillar shape or a wall shape. The upper support pattern 83B may include a plurality of lower portions each having a narrow horizontal width and a plurality of upper portions each having a wide horizontal width. The lower portions of the upper support pattern 83B may be located in the upper gap G2. Compared with FIG. 2A, in a top view or a side view, the upper support pattern 83B may have a shape of a plurality of islands or a plurality of squares arranged in a lattice shape that does not extend in any of horizontal directions. Accordingly, the support pattern 80B may have a plurality of pillars or walls downwardly extending toward the underlayer 40 through the upper gap G2 and the lower gap G1.

Figure 2C:
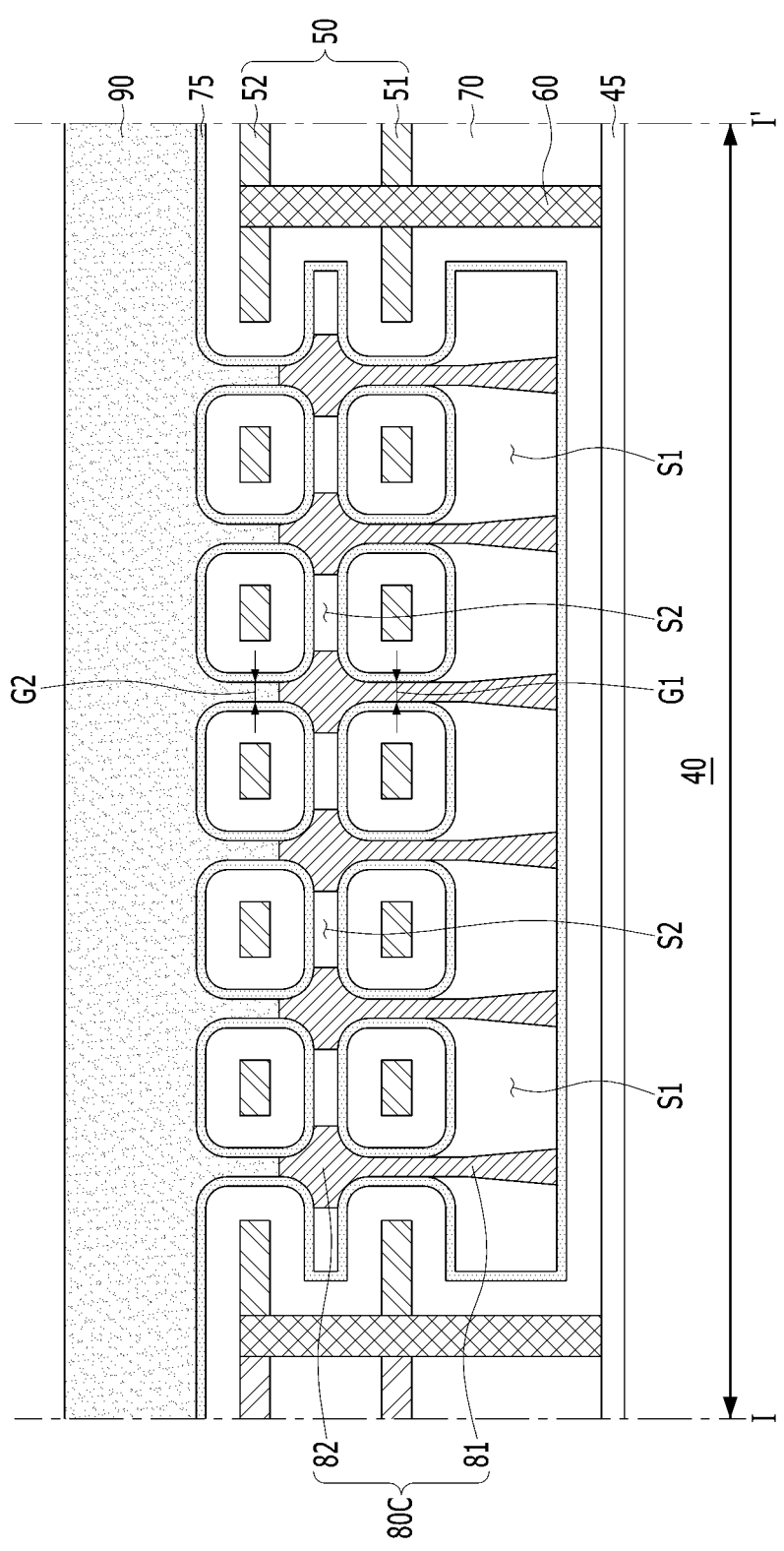

Referring to FIG. 2C, an alignment pattern of a semiconductor device according to some embodiments of the present invention disclosure may include an underlayer 40, a barrier layer 45, core layers 50, post patterns 60, a passivation layer 70, a coating layer 75, a support pattern 80C, and a capping insulating layer 90. The alignment pattern may further include empty spaces S1 and S2 therein. The support pattern 80C may include a plurality of lower support patterns 81 and a plurality of intermediate support patterns 82. Compared with FIGS. 2A and 2B, the upper support patterns 83A and 83B may be omitted. The capping insulating layer 90 may completely fill the upper gap G2.

Figure 2D:
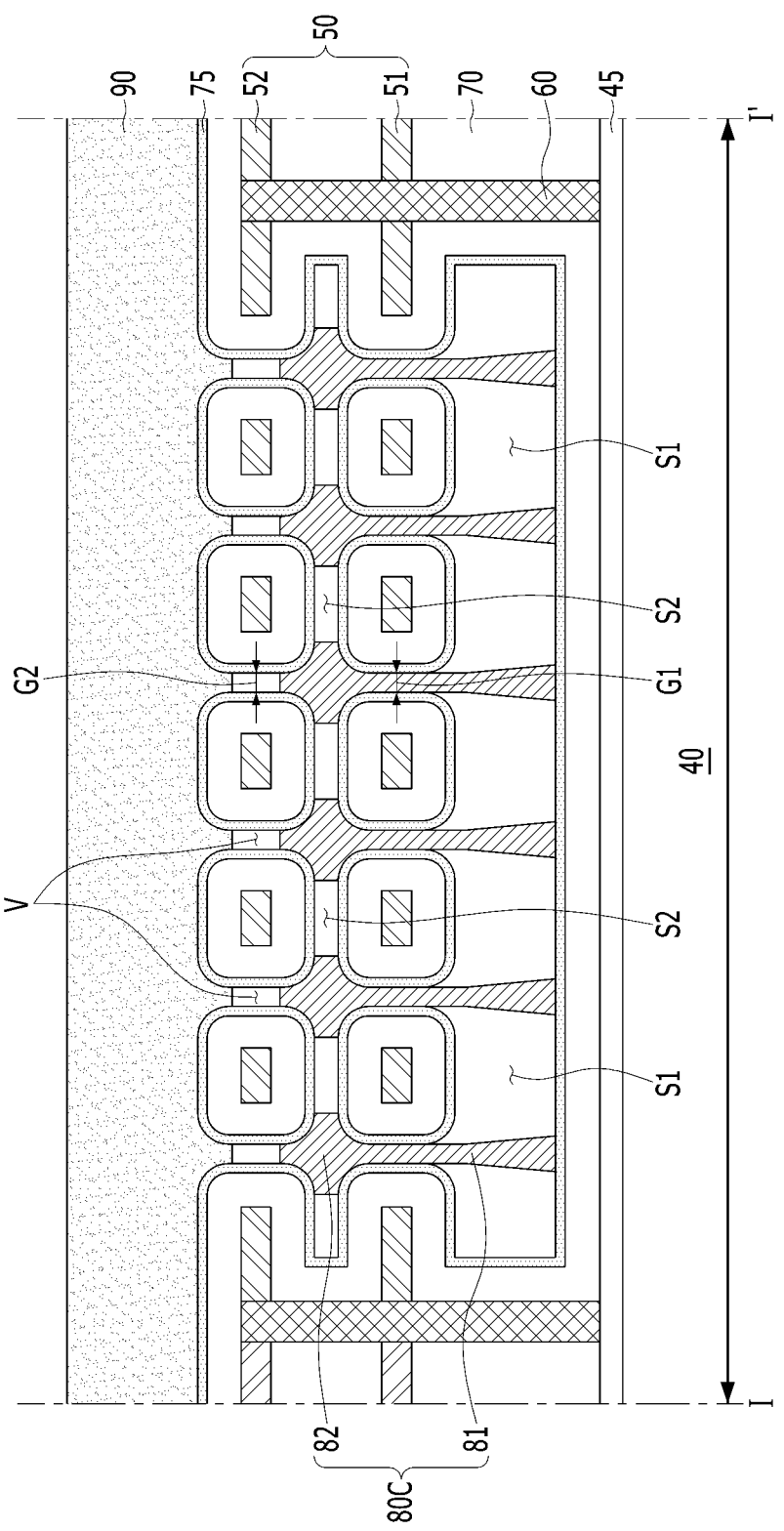

Referring to FIG. 2D, an alignment pattern of a semiconductor device according to some embodiments of the present invention disclosure may include an underlayer 40, a barrier layer 45, core layers 50, post patterns 60, a passivation layer 70, a coating layer 75, a support pattern 80C, and a capping insulating layer 90. The support pattern 80C may include a plurality of lower support patterns 81 and a plurality of intermediate support patterns 82. Compared with FIG. 2C, a plurality of voids V may be formed between upper ends of the intermediate support patterns 82 and the capping insulating layer 90.

FIGS. 3A to 3I are longitudinal cross-sectional views taken along a line I-I' of FIG. 1 to describe a method of forming an alignment pattern according to some embodiments of the present invention disclosure.

Figure 3A:
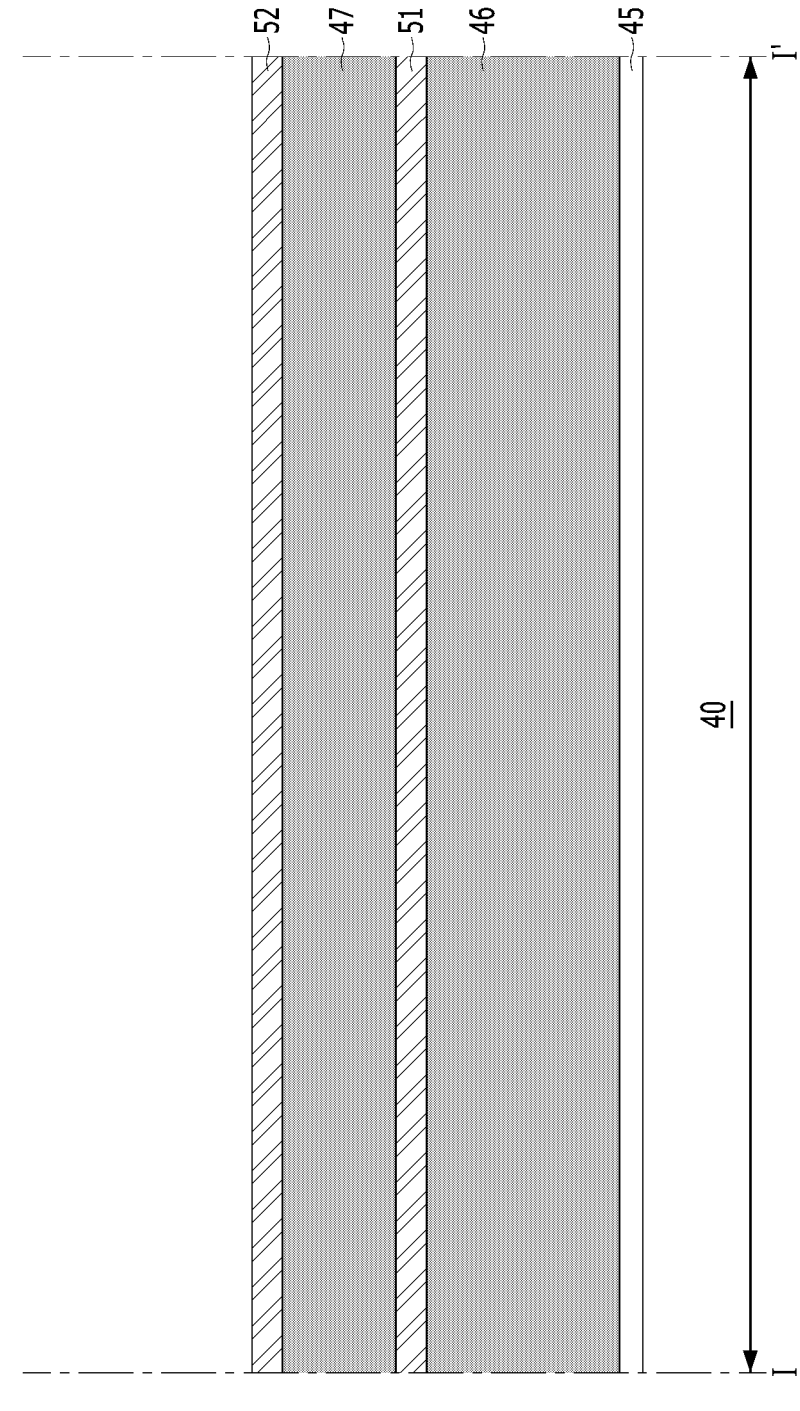
FIGS. 3A to 3I are longitudinal cross-sectional views taken along a line I-I' of FIG. 1 to describe a method of forming an alignment pattern according to some embodiments of the present invention disclosure.

Referring to FIG. 3A, a method of forming an alignment pattern according to some embodiments of the present invention disclosure may include forming a barrier layer 45 on an underlayer 40, forming a lower sacrificial layer 46 on the barrier layer 45, forming a lower core layer 51 on the lower sacrificial layer 46, forming an upper sacrificial layer 47 on the lower core layer 51, and forming an upper core layer 52 on the upper sacrificial layer 47. The underlayer 40 may include one of a semiconductor substrate, an interlayer insulating layer, an etch stop layer, a planarization layer, a metal layer, or other insulating material layers. Forming the barrier layer 45 may include forming a barrier metal layer or a barrier insulating layer on the underlayer 40 by performing a deposition process. The barrier metal layer may include forming a titanium (Ti) layer, a titanium nitride (TiN) layer, a tantalum (Ta) layer, a tantalum nitride (TaN) layer, or a tungsten nitride (WN) layer. The barrier insulating layer may include an inorganic material that does not contain oxygen, such as silicon nitride (SiN) or silicon carbon nitride (SiCN). Forming the lower sacrificial layer 46, the lower core layer 51, the upper sacrificial layer 47, and the upper core layer 52 may include forming inorganic layers by performing deposition processes such as chemical vapor deposition (CVD) process. The lower sacrificial layer 46 and the upper sacrificial layer 47 may include the same material. For example, the lower sacrificial layer 46 and the upper sacrificial layer 47 may include a silicon oxide layer. The lower core layer 51 and the upper core layer 52 may include the same material. For example, the lower core layer 51 and the upper core layer 52 may include silicon nitride. The sacrificial layers 46 and 47 may have an etch selectivity with respect to the core layers 51 and 52.

Figure 3B:
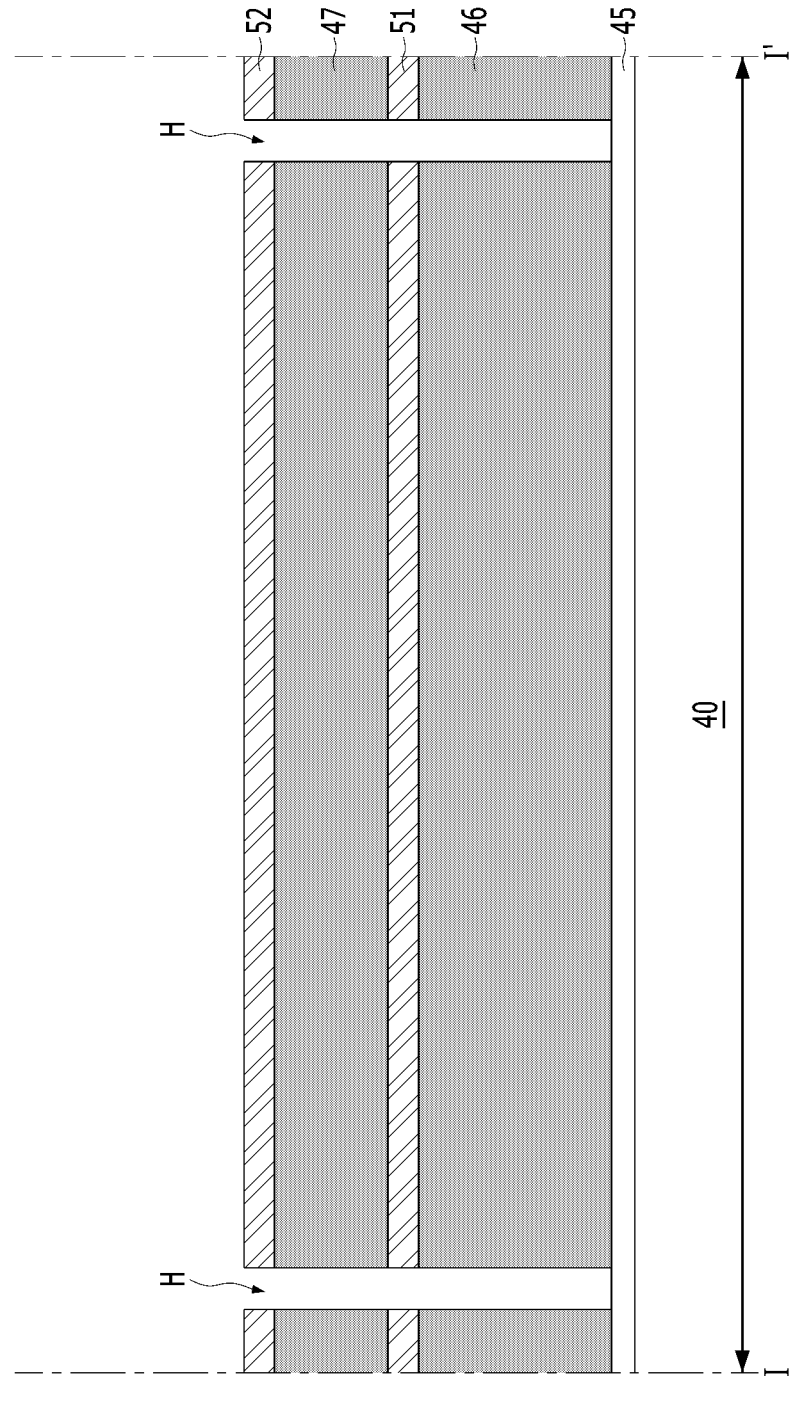

Referring to FIG. 3B, the method may further include forming holes H. The holes H may be formed by performing a photolithography process and an etching process. The holes H may vertically penetrate the sacrificial layers 46 and 47 and the core layers 51 and 52 to expose the barrier layer 45. In a top view, the holes H may have a trench shape extending in a horizontal direction. In some embodiments, in a top view, the holes H may have a circular shape. In some embodiments, in a top view, the holes H may have a polygonal shape.

Figure 3C:
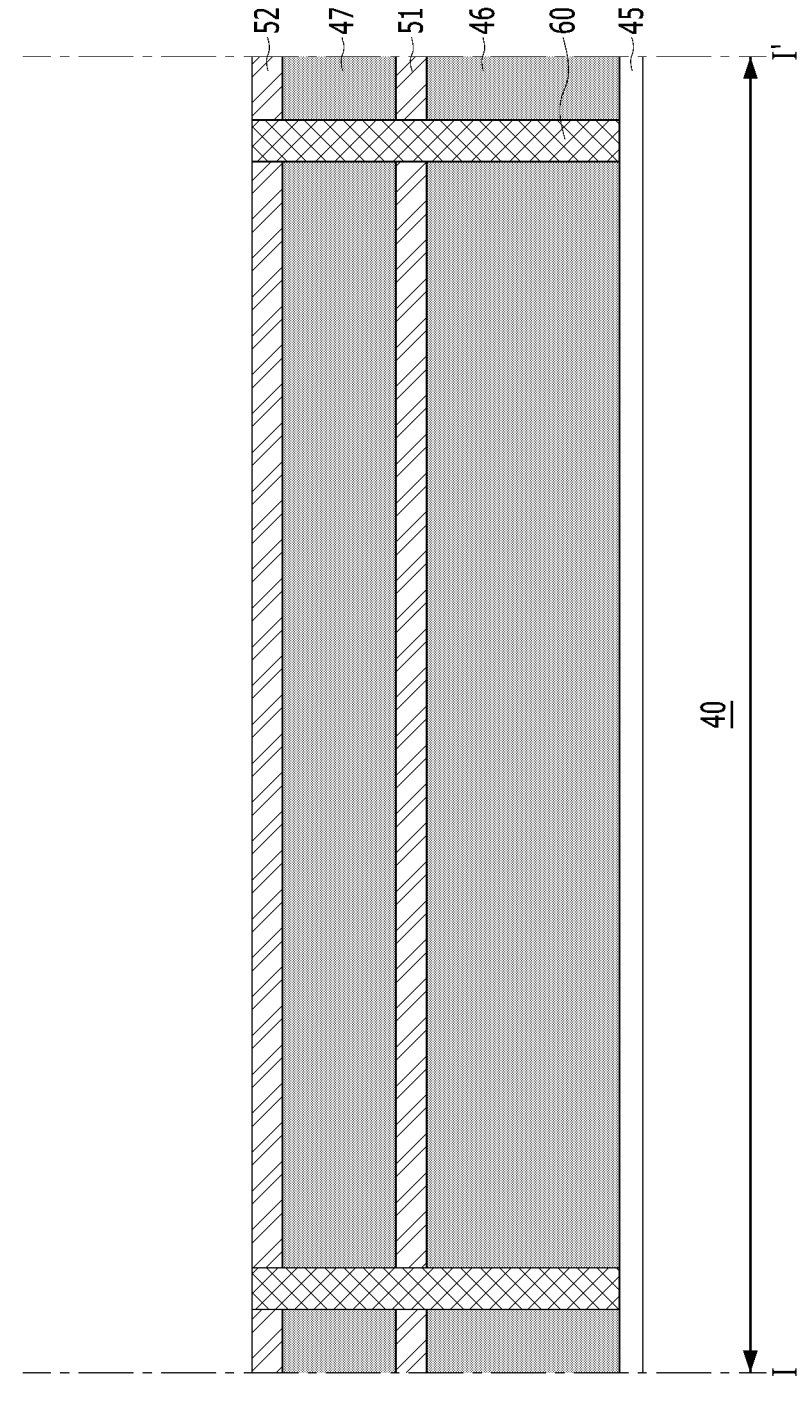

Referring to FIG. 3C, the method may further include forming post patterns 60 in the holes H. Forming the post patterns 60 may include performing a deposition process and a planarization process. The planarization process may include an etch-back process or a CMP (chemical mechanical process) process. The post patterns 60 may include a material having an etch selectivity with respect to the sacrificial layers 46 and 47 and the core layers 51 and 52. For example, the post patterns 60 may include poly-crystalline silicon (poly-Si), silicon-germanium (SiGe), or a metal-based material.

Figure 3D:
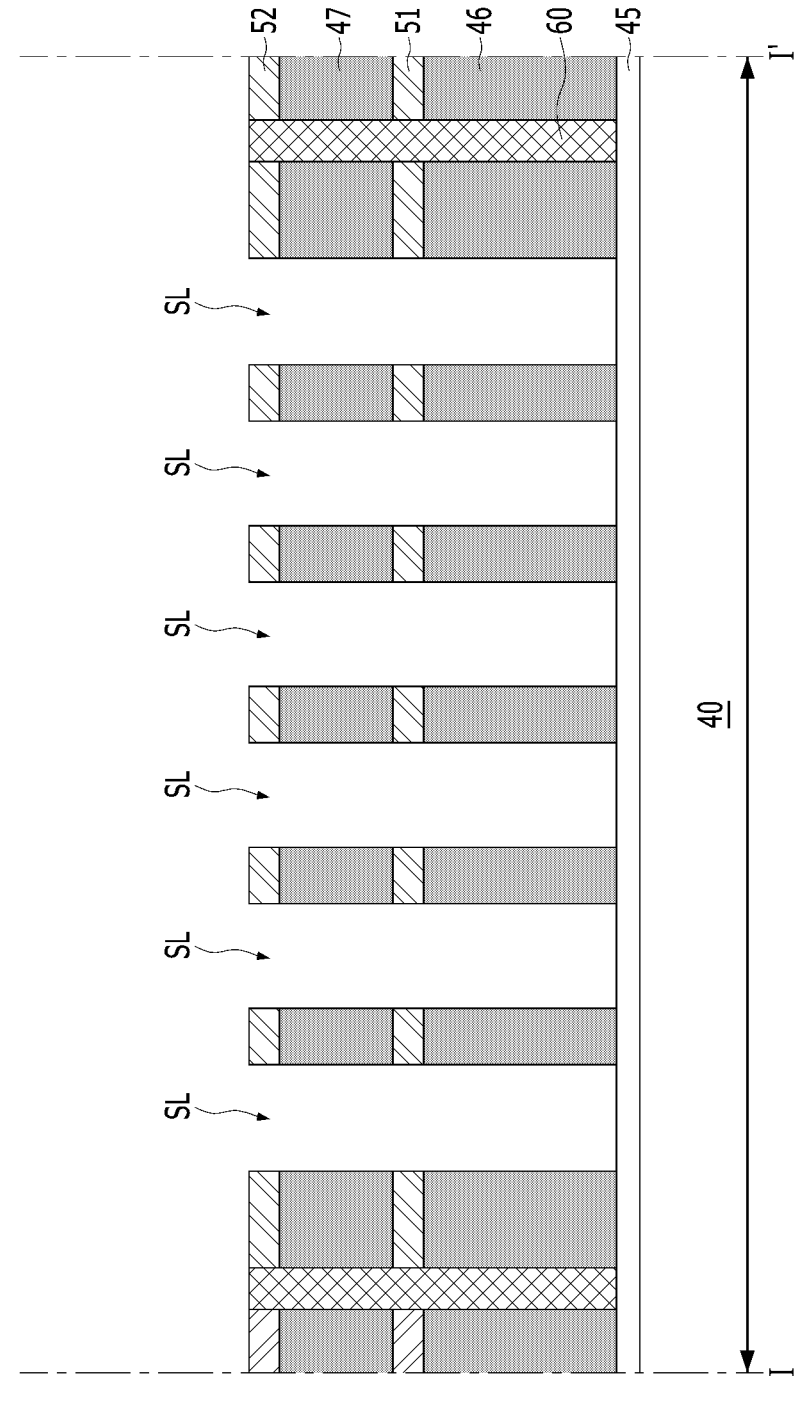

Referring to FIG. 3D, the method may further include forming slits SL. Forming the slits SL may include performing a selective etching process. The slits SL may vertically penetrate the sacrificial layers 46 and 47 and the core layers 51 and 52 to expose the barrier layer 45. In a top view, each of the slits SL may have a bar shape. The core layers 51 and 52 may be divided and formed into a plurality of segments spaced apart from each other by the slits in a horizontal direction.

Figure 3E:
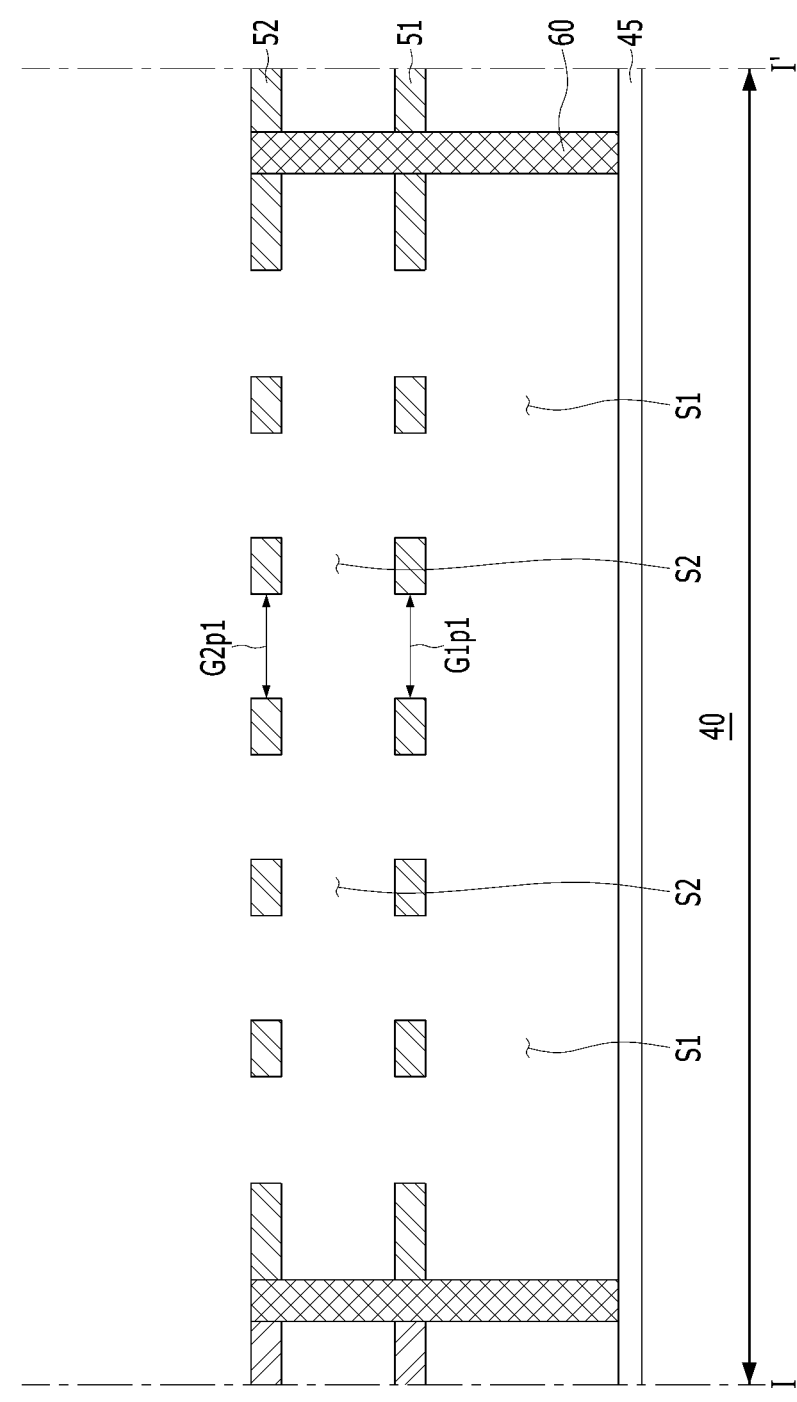

Referring to FIG. 3E, the method may further include removing the sacrificial layers 46 and 47 through the slits SL. Removing the sacrificial layers 46 and 47 may include performing a wet etching process to form empty spaces S1 and S2 and first preliminary gaps G1p1 and G2p1. The surfaces of the segments of the core layers 51 and 52 and the post patterns 60 may be exposed in the empty spaces S1 and S2. The empty spaces S1 and S2 may include a lower empty space S1 between the barrier layer 45 and the lower core layer 51 on the underlayer 40 and an upper empty space S2 between the segments of the lower core layer 51 and the upper core layer 52. The first preliminary gaps G1p1 and G2p1 may include a first lower preliminary gap G1p1 between the segments of the lower core layer 51 and a first upper preliminary gap G2p1 between the segments of the upper core layer 52. That is, the first lower preliminary gaps G1p1 may each have a horizontal width defined by the segments of the lower core layer 51, and a horizontal width of the first upper preliminary gap G2p1 may be defined by the segments of the upper core layer 52. For example, the first lower preliminary gaps G1p1 may have a horizontal width defined by the distance between consecutive lower segments of the lower core layer 51, and a horizontal width of the first upper preliminary gaps G2p1 may be defined by the distance between consecutive upper segments of the upper core layer 52.

Figure 3F:
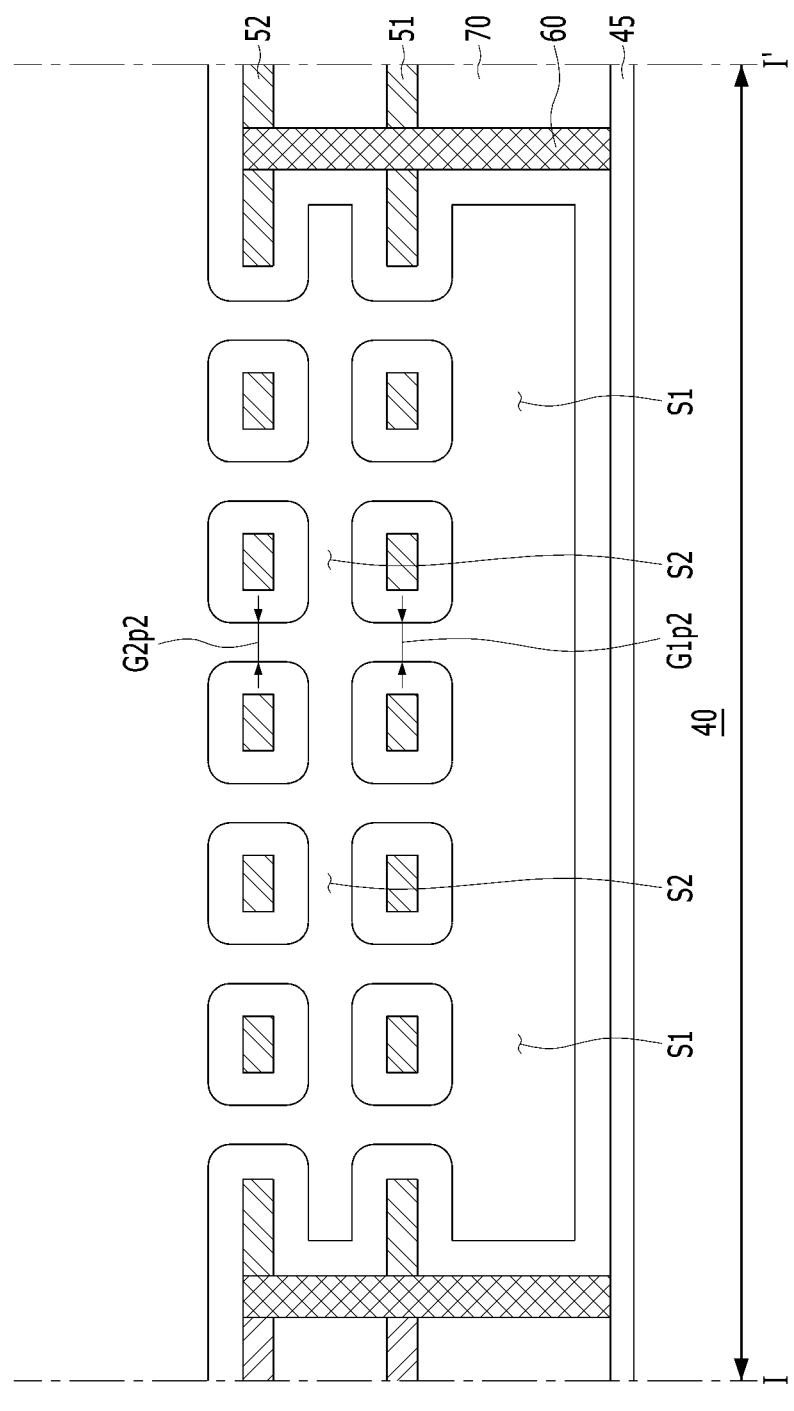

Referring to FIG. 3F, the method further may include forming a passivation layer 70 on surfaces of the segments of the core layers 51 and 52 and the post patterns 60 exposed in the empty spaces S1 and S2. Forming the passivation layer 70 may include performing a deposition process such as CVD or atomic layer deposition (ALD) to form a silicon layer or a silicon germanium layer. The passivation layer 70 may be evenly formed on the surfaces of the barrier layer 45, the post patterns 60, the segments of the lower core layer 51, and the segments of the upper core layer 52 on the underlayer 40. The first lower preliminary gap G1p1 may be changed into a second lower preliminary gap G1p2 narrowed by the passivation layer 70 surrounding the lower segments, and the first upper preliminary gap G2p1 may be changed into the second upper preliminary gap G2p2 narrowed by the passivation layer 70 surrounding the upper segments. That is, a horizontal width of the second lower preliminary gap G1p2 may be defined by the passivation layer 70 on the surface of the lower core layer 51, and a horizontal width of the second upper preliminary gap G2p2 may be defined by the passivation layer 70 on the surface of the upper core layer 52.

Figure 3G:
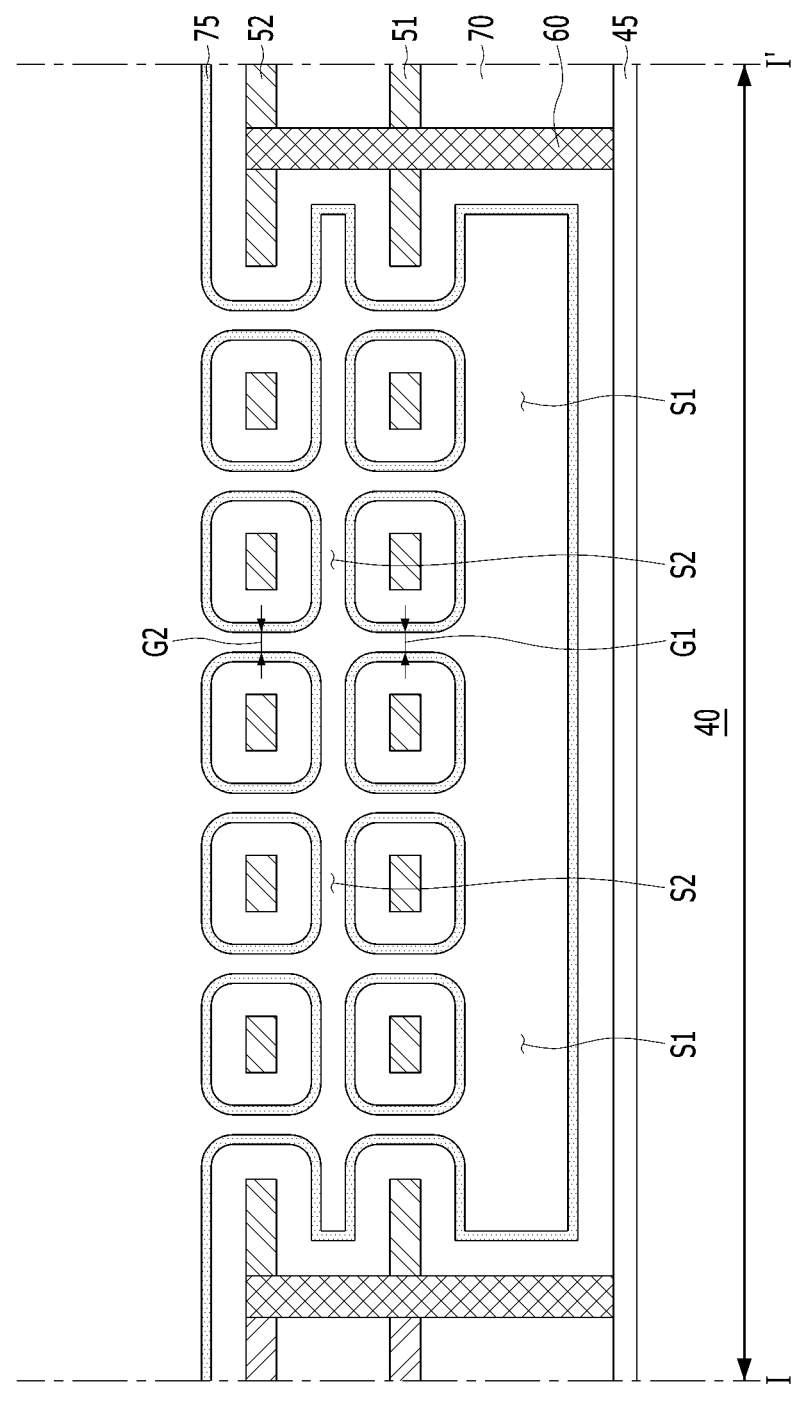

Referring to FIG. 3G, the method may further include conformally forming a coating layer 75 on the surface of the passivation layer 70. Forming the coating layer 75 may include performing a deposition process such as CVD or ALD to form at least one of a tungsten (W) layer, a tungsten nitride (WN) layer, a titanium (Ti) layer, a titanium nitride layer (TiN), or various metal nitride layers. The second lower preliminary gap G1p2 may be formed to the lower gap G1 narrowed by the coating layer 75, and the second upper preliminary gap G2p2 may be formed to the upper gap G2 narrowed by the coating layer 75. That is, a horizontal width of the lower gap G1 may be defined by the coating layer 75 on the surface of the passivation layer 70 on the surface of the lower core layer 51, and a horizontal width of the upper gap G2 may be defined by the coating layer 75 on the surface of the passivation layer 70 on the surface of the upper core layer 52.

Figure 3H:
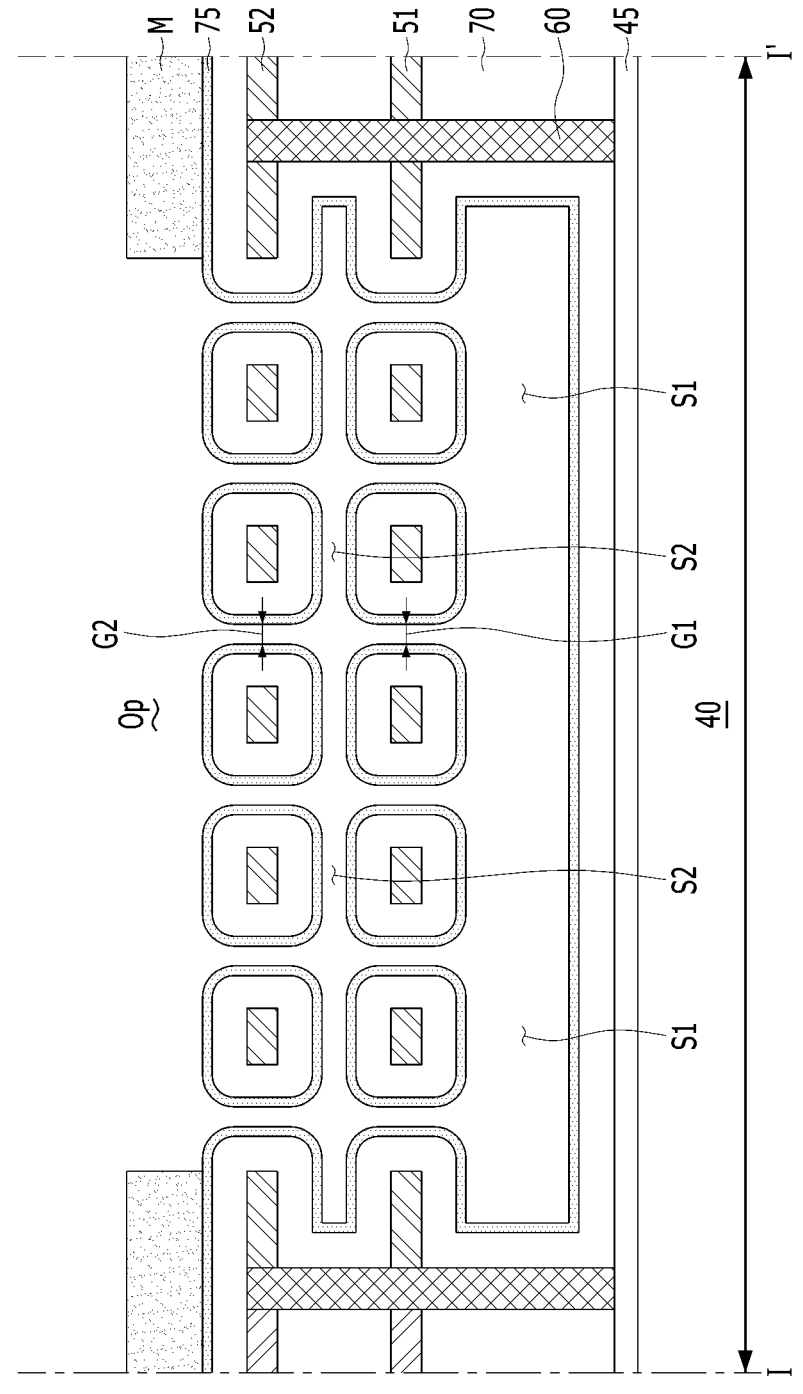

Referring to FIG. 3H, the method may further include forming a mask pattern M having an opening Op exposing the upper gaps G2. Forming the mask pattern M may include forming an inorganic pattern such as a silicon oxide ($SiO_2$) pattern or a silicon nitride (SiN) pattern by performing a photolithography process and an etching process. In some embodiments, the mask pattern M may include a polymeric organic material such as a photoresist.

Figure 3I:
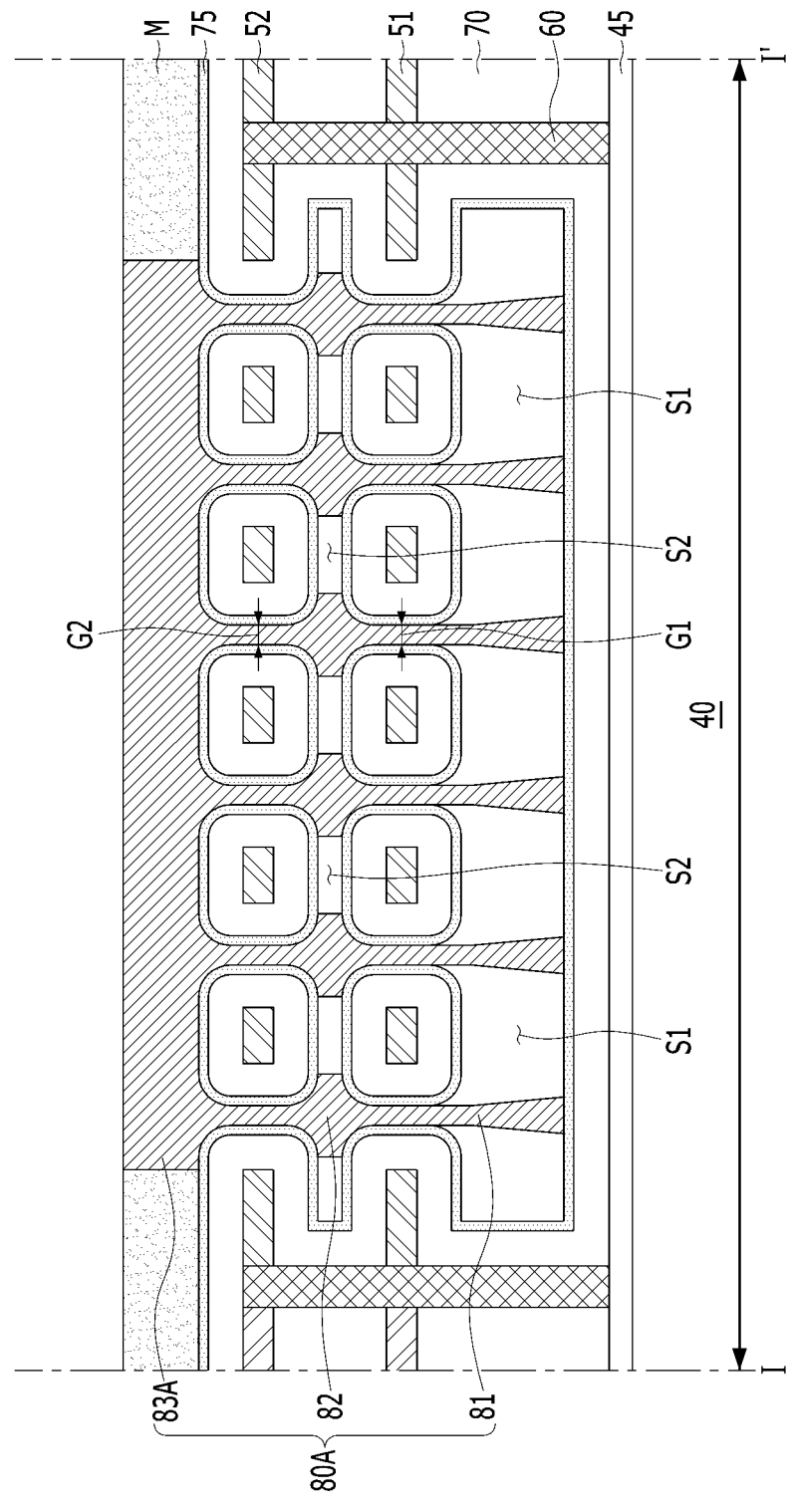

Referring to FIG. 3I, the method may further include forming a support pattern 80A through the opening Op. Forming the support pattern 80A may include filling the empty spaces S1 and S2 and the gaps G1 and G2 with a metal by performing a deposition process such as PVD. For example, the support pattern 80A may include a metal such as tungsten (W). In some embodiments, the support pattern 80A may include an inorganic insulating material such as silicon nitride (SiN). The support pattern 80A may partially fill the lower empty space S1 and the upper empty space S2. The support pattern 80A may completely fill the lower gap G1 and the upper gap G2. Then, the mask pattern M may be removed. In some embodiments, the mask pattern M may remain without being removed. Thereafter, referring to FIG.

2A, the method may further include forming a capping insulating layer 90. Forming the capping insulating layer 90 may include forming an inorganic material such as silicon oxide ($SiO_2$) by performing a deposition process.

Figure 4A:
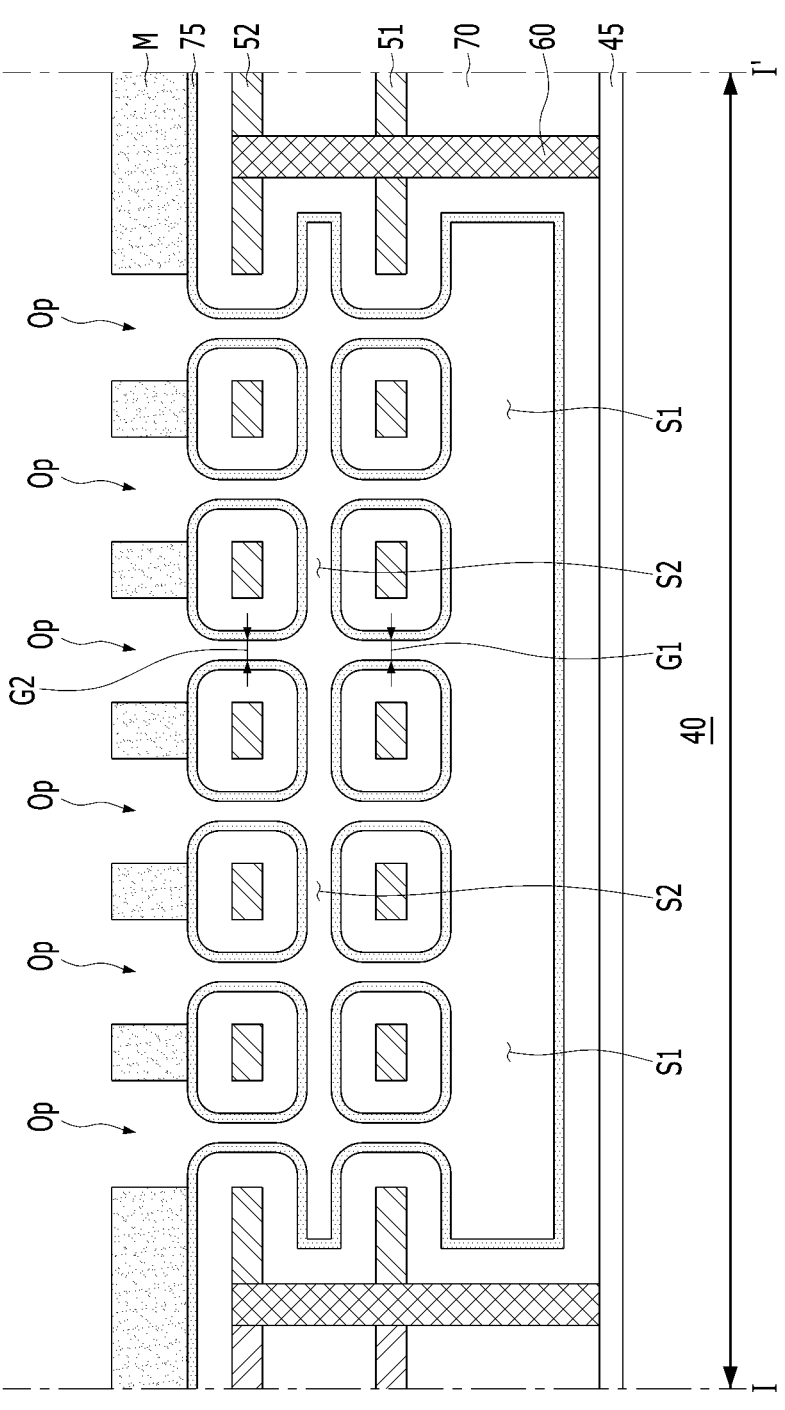
FIGS. 4A and 4B are longitudinal cross-sectional views taken along the line I-I' of FIG. 1 to describe a method of forming an alignment pattern according to some embodiments of the present invention disclosure.
Figure 4B:
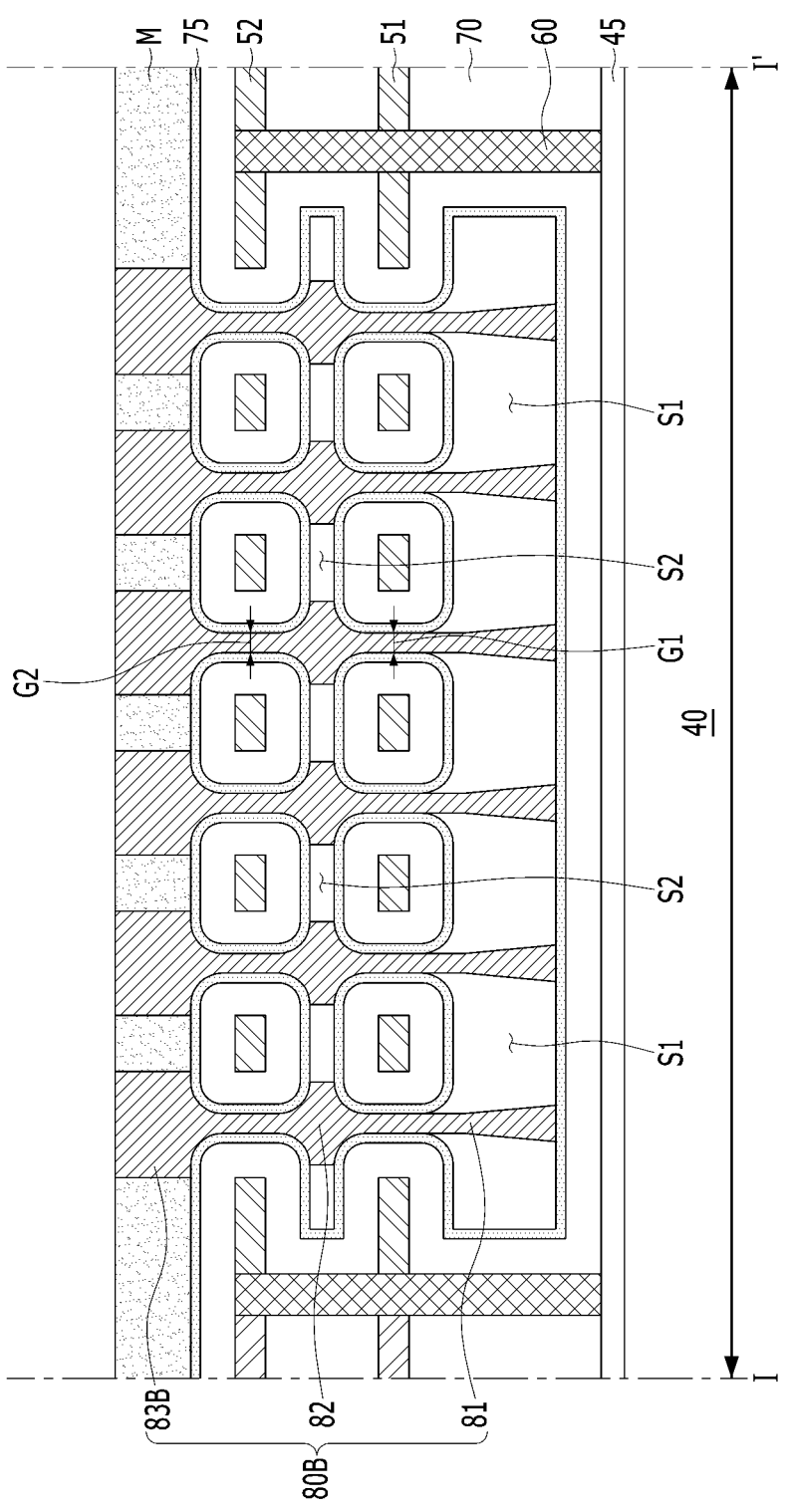

FIGS. 4A and 4B are longitudinal cross-sectional views taken along the line I-I' of FIG. 1 to describe a method of forming an alignment pattern according to some embodiments of the present invention disclosure. Referring to FIG. 4A, a method of forming an alignment pattern of a semiconductor device according to some embodiments of the present invention disclosure may include performing the processes described with reference to FIGS. 3A to 3H to form a mask pattern M having openings Op to expose the upper gaps G2.

Referring to FIG. 4B, the method may further include forming a support patterns 80B through the openings Op. The support patterns 80B may have a pillar shape or a wall shape extending from a frontside to a backside of the figure. The support patterns 80B may have the wall shape extending from a left side to a right side in a left of right side view. The support pattern 80B may include a plurality of lower support patterns 81, a plurality of intermediate support patterns 82, and a plurality of upper support patterns 83B. Each of the lower support patterns 81 may include a lower portion having a wider horizontal width and an upper portion having a narrower horizontal width. Each of the intermediate support patterns 82 may have a convex central portion.

Figure 5A:
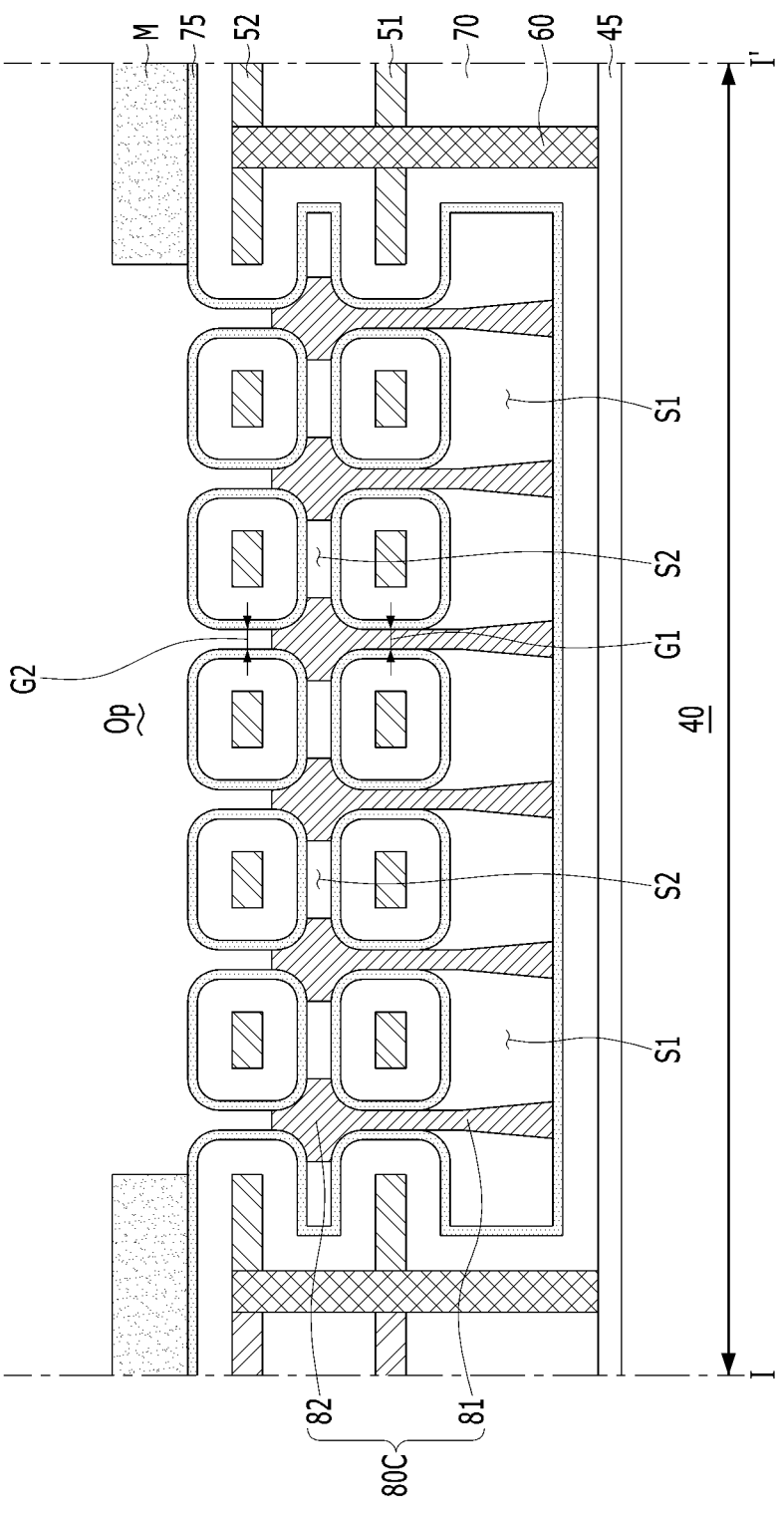
FIGS. 5A and 5B are longitudinal cross-sectional views taken along the line I-I' of FIG. 1 to describe methods of forming an alignment pattern of a semiconductor device according to embodiments of the present invention disclosure.
Figure 5B:
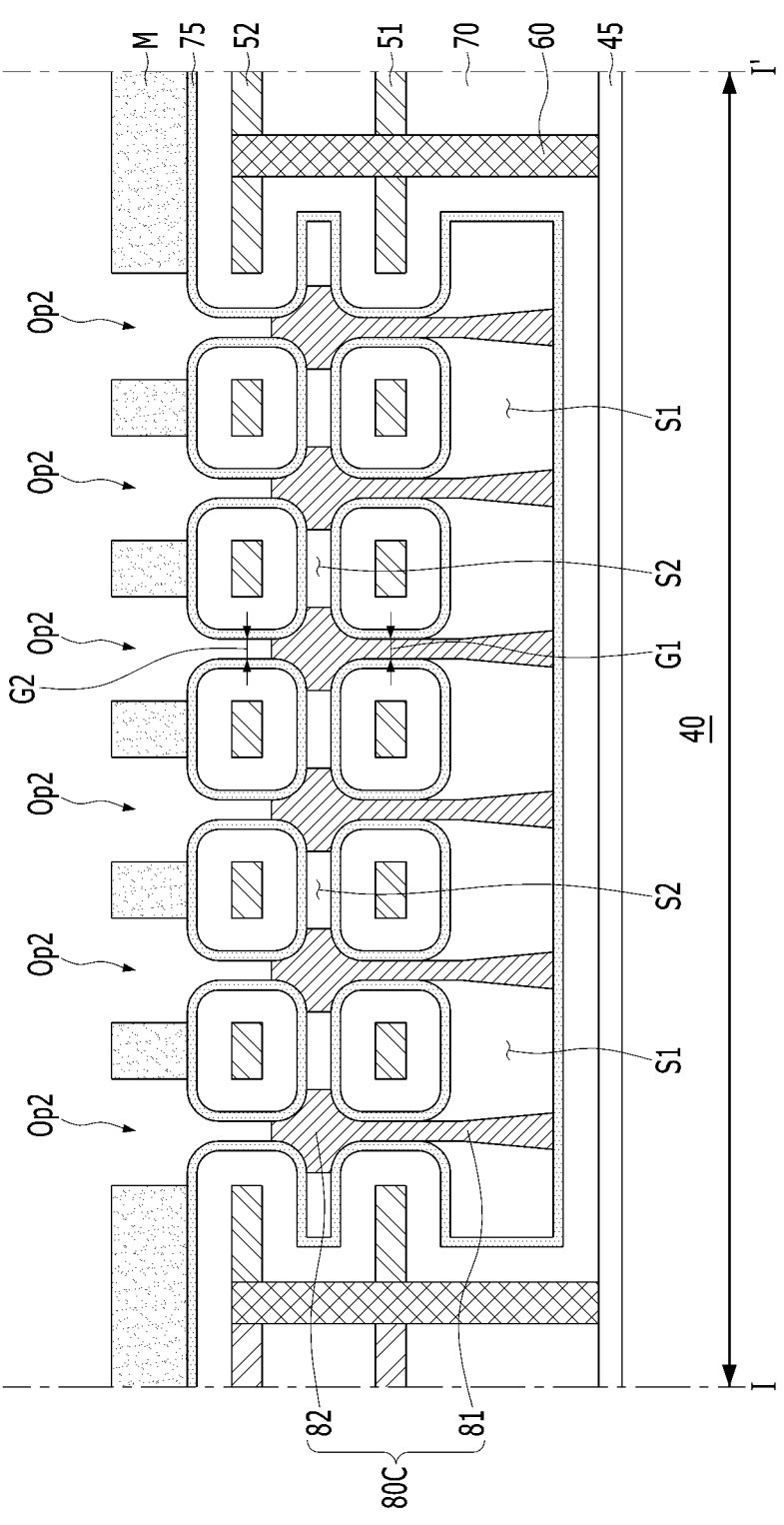

FIGS. 5A and 5B are longitudinal cross-sectional views taken along the line I-I' of FIG. 1 to describe methods of forming an alignment pattern of a semiconductor device according to embodiments of the present invention disclosure. Referring to FIG. 5A, a method of forming an alignment pattern of a semiconductor device according to some embodiments of the present invention disclosure may include performing the processes described with reference to FIGS. 3A to 3H, and forming a support pattern 80C. The support pattern 80C May include a plurality of lower support patterns 81 and a plurality of intermediate support patterns 82. Forming the support pattern 80C may include performing the processes described with reference to FIG. 3I to form a mask pattern M having an opening Op exposing the upper gaps G, and forming uppermost ends of intermediate support patterns 82 of the support pattern 80C to be positioned at the same or lower level as the upper core layer 52. Thereafter, referring to FIG. 2C, the method may further include forming a capping insulating layer 90.

Referring to FIG. 5B, a method of forming an alignment pattern of a semiconductor device according to some embodiments of the present invention disclosure may include performing the processes described with reference to FIGS. 3A to 3H and 4A, and forming a support pattern 80C. The support pattern 80C may include a plurality of lower support patterns 81 and a plurality of intermediate support patterns 82. Forming the support pattern 80C may include performing the processes described with reference to FIG. 3I to form a mask pattern M having a plurality of openings Op individually exposing the upper gaps G, and forming uppermost ends of the intermediate support patterns 82 the support pattern 80C to be positioned at the same or lower level as the upper core layer 52. Thereafter, referring to FIG. 2D, the method may further include forming a capping insulating layer 90. Voids V may be formed between the upper ends of the support pattern 80C and the capping insulating layer 90.

According to embodiments of the present invention disclosure, because the semiconductor devices include the alignment pattern having the support pattern, it is possible to prevent the alignment pattern from being physically damaged.

The support patterns according to embodiments of the present invention disclosure may block the formation of cracks, retard the propagation and expansion of cracks, or prevent the formation of cracks in their genesis in the semiconductor chip.

While the present invention has been described with respect to specific embodiments, it will be apparent to those having ordinary skill in the art of the present invention that various other embodiments, or changes and modifications thereof may be made without departing from the scope and spirit of the present invention as defined in the following claims.

What is claimed is:

1. A semiconductor device comprising:
an underlayer;
a lower core layer spaced apart from the underlayer in a vertical direction from a top surface of the underlayer, wherein the lower core layer extends in a horizontal direction parallel to the top surface of the underlayer, and wherein the lower core layer includes a plurality of lower segments spaced apart from each other in the horizontal direction;
an upper core layer spaced apart from the lower core layer in the vertical direction, wherein the upper core layer extends in the horizontal direction, and wherein the upper core layer includes a plurality of upper segments spaced apart from each other in the horizontal direction;
a post pattern vertically penetrating the upper core layer and the lower core layer;
a passivation layer surrounding the lower core layer, the upper core layer, and the post pattern;
a coating layer surrounding the passivation layer; and
a support pattern extending in the vertical direction and passing through the lower core layer, the upper core layer, the passivation layer, and the coating layer.

2. The semiconductor device of claim 1, further comprising:
a lower empty space defined between the underlayer and the lower core layer;
an upper empty space defined between the lower core layer and the upper core layer;
a lower gap disposed between the plurality of lower segments of the lower core layer, wherein the lower gap is defined by the coating layer surrounding the passivation layer surrounding the lower core layer; and
an upper gap disposed between the plurality of upper segments of the upper core layer, wherein the upper gap is defined by the coating layer surrounding the passivation layer surrounding the upper core layer.

3. The semiconductor device of claim 2,
wherein the support pattern includes:
a lower support pattern located in the lower empty space and extending into the lower gaps; and
an intermediate support pattern located on the lower support pattern and extending into the upper gaps.

4. The semiconductor device of claim 3,
wherein the lower support pattern includes:
a lower portion located in the lower empty space; and
an upper portion located in the lower gap,
wherein the intermediate support pattern includes:
a lower portion located in the lower gap; and
an upper portion located in the upper gap.

5. The semiconductor device of claim 3, wherein the lower support pattern and the intermediate support pattern include a same material.

6. The semiconductor device of claim 3, further comprising:

an upper support pattern including:

a lower portion located in the upper gap; and an upper portion located on the coating layer surrounding the passivation layer surrounding the upper core layer and extending in the horizontal direction.

7. The semiconductor device of claim 2, wherein a horizontal width of the lower gap is defined by the coating layer surrounding the passivation layer surrounding the lower segments of the lower core layer, and a horizontal width of the upper gap is defined by the coating layer surrounding the passivation layer surrounding the upper segments of the upper core layer.

8. The semiconductor device of claim 1, further comprising:

a barrier layer on the underlayer, wherein:

the underlayer includes at least one of a metal and a metal compound, and the barrier layer includes at least one of titanium, titanium nitride, tantalum, tantalum nitride, tungsten, tungsten nitride, and silicon nitride.

9. The semiconductor device of claim 1, wherein the lower core layer and the upper core layer include silicon nitride.

10. The semiconductor device of claim 1, wherein the post pattern includes a material having an etch selectivity with respect to the lower core layer and the upper core layer.

11. The semiconductor device of claim 1, wherein the coating layer includes a reflecting material.

12. The semiconductor device of claim 1, wherein at least one of the lower core layer, the upper core layer, and the passivation layer includes opaque material.

13. The semiconductor device of claim 1, further comprising:

a capping insulating layer on the coating layer surrounding the passivation layer surrounding the support pattern and the upper core layer.

14. The semiconductor device of claim 13, further comprising:

a void between an upper end of the support pattern and the capping insulating layer.

15. A semiconductor device comprising:

an alignment pattern, the alignment pattern includes:

an underlayer;

a core layer including segments spaced apart from the under layer in a vertical direction, wherein the segments are individually divided in a horizontal direction;

a passivation layer surrounding a surface of the core layer;

a coating layer surrounding a surface of the passivation layer;

a support pattern vertically passing through the core layer, the passivation layer, and the coating layer;

an empty space between the under layer and the core layer; and a gap between the segments of the coating layer, wherein the support pattern vertically passes through the gap.

16. A semiconductor device comprising:

an underlayer;

a barrier layer on the underlayer;

a passivation layer on the barrier layer;

a lower core layer formed inside the passivation layer, the lower core layer including a plurality of lower segments extending in a horizontal direction parallel to the barrier layer and the underlayer;

an upper core layer formed inside the passivation layer, the upper core layer including a plurality of spaced apart upper segments extending in the horizontal direction;

at least one post pattern penetrating the upper core layer, the lower core layer and the passivation layer to expose the barrier layer, the at least one post pattern being configured to support at least one of the upper and lower segments;

a coating layer surrounding a surface of the passivation layer; and a support pattern including a plurality of lower support patterns and a plurality of upper support patterns vertically passing through the lower core layer, the upper core layer, the passivation layer, and the coating layer.

* * * * *